United States Patent
Harada et al.

(10) Patent No.: US 6,557,154 B1
(45) Date of Patent: Apr. 29, 2003

(54) PRINTED CIRCUIT BOARD DESIGN SUPPORT SYSTEM, PRINTED CIRCUIT BOARD DESIGN METHOD AND STORAGE MEDIUM STORING CONTROL PROGRAM FOR SAME

(75) Inventors: Takashi Harada, Tokyo (JP); Hideki Sasaki, Tokyo (JP); Eiji Hankui, Tokyo (JP); Kiyoshi Asao, Tokyo (JP)

(73) Assignee: NEC Corporation, Tokyo (JP)

( * ) Notice: Subject to any disclaimer, the term of this patent is extended or adjusted under 35 U.S.C. 154(b) by 25 days.

(21) Appl. No.: 09/718,431

(22) Filed: Nov. 24, 2000

(30) Foreign Application Priority Data

Nov. 24, 1999 (JP) .......................................... 11-332203

(51) Int. Cl.$^7$ .............................................. G06F 17/50
(52) U.S. Cl. .............................. 716/11; 716/5; 716/15; 361/763; 361/764; 361/780; 174/260
(58) Field of Search ...................... 716/1–21; 257/731; 324/548; 361/826, 794, 780, 763, 761; 430/5; 333/181; 29/846; 703/14; 235/462.42; 360/97.01; 710/301; 307/89, 91; 340/870.11; 174/266, 260

(56) References Cited

U.S. PATENT DOCUMENTS

| | | | |
|---|---|---|---|
| 5,502,644 A | * | 3/1996 | Hamilton et al. ............... 716/5 |
| 5,912,809 A | * | 6/1999 | Steigerwald et al. ......... 361/780 |
| 5,926,377 A | * | 7/1999 | Nakao et al. ................ 361/763 |
| 6,084,779 A | * | 7/2000 | Fang .......................... 361/763 |
| 6,395,996 B1 | * | 5/2002 | Tsai et al. .................... 174/260 |
| 2001/0018761 A1 | * | 8/2001 | Sasaki et al. ................. 716/15 |

FOREIGN PATENT DOCUMENTS

| JP | 6-203102 | 7/1994 |
|---|---|---|
| JP | 10-97560 | 4/1998 |
| JP | 10-184469 | 7/1998 |
| JP | 10-275981 | 10/1998 |
| JP | 10-303568 | 11/1998 |
| JP | 11-40905 | 2/1999 |
| JP | 11-145569 | 5/1999 |
| JP | 1-103-905 A2 | * 5/2001 |

OTHER PUBLICATIONS

Archambeault et al., "Analysis of Power/Ground–Plane EMI Decoupling Performance Using the Partial_Element Equivalent Circuit Technoque", IEEE, Nov. 2001, pp. 437–445.*

Harad et al., "Investigation on Power Distribution Plane Resonance in Multilayer Printed Circuit Boards Using a Transmission–line Model", IEEE, May 1999, pp. 21–24.*

(List continued on next page.)

*Primary Examiner*—Matthew Smith
*Assistant Examiner*—Helen Rossoshek
(74) *Attorney, Agent, or Firm*—Young & Thompson

(57) ABSTRACT

A PCB (Printed Circuit Board) design support system and a PCB design method reduce radiation of electromagnetic waves by optimizing layout of a substrate while following a conventional method for designing a PCB and maintaining a conventional structure. The PCB design support system includes an input information section for a ground plane structure, power plane structure and layout of a PCB, a circuit model section for calculating voltages between the ground plane and power plane and distribution of currents flowing on the ground plane and power plane using input information, a frequency selection section and a section to display obtained voltage and current distribution in a form of two-dimensional voltage and current distribution maps corresponding to shapes of the PCB. The PCB design support system enables a via-hole disposed between planes and/or wiring installed between planes causing variations in voltages to be specified in a precautionary manner from a PCB design stage.

19 Claims, 27 Drawing Sheets

22;calculation model expressed by equivalent circuit

OTHER PUBLICATIONS

Sasaki et al., "A New VLSI Decoupling Circuit for Suppressing Rdiation Emission from Multilayer Printed Circuit Boards", IEEE, Aug. 2000, pp. 157–162.*

Fan et al., "Quantifying SMT Decoupling Capacitor Placement DC Power–Bus Design for Multilayer PCBs", IEEE, Nov. 20001, pp. 588–599.*

"Small–size Plane Antenna", *Transaction of the Institute of Electronics, Information and Communication Engineers*, 1996, pp. 126–131.

Lee et al., "Modeling and Analysis of Multichip Module Power Supply Planes", Part B, vol. 18, No. 4, Nov. 1995, *IEEE Transactions on Components, Packaging and Manufacturing Technology*, pp. 628–639.

Harada et al., "Investigation on Radiated Emission Characteristics of Multilayer Printed Circuit Boards", vol. E80–B, No. 11, Nov. 1997, *IEICE Trans. Commun.*, pp. 1645–1651.

* cited by examiner

- 31; decoupling capacitor
- 32; pad
- 33; via-hole
- 12; ground plane
- 13; power plane

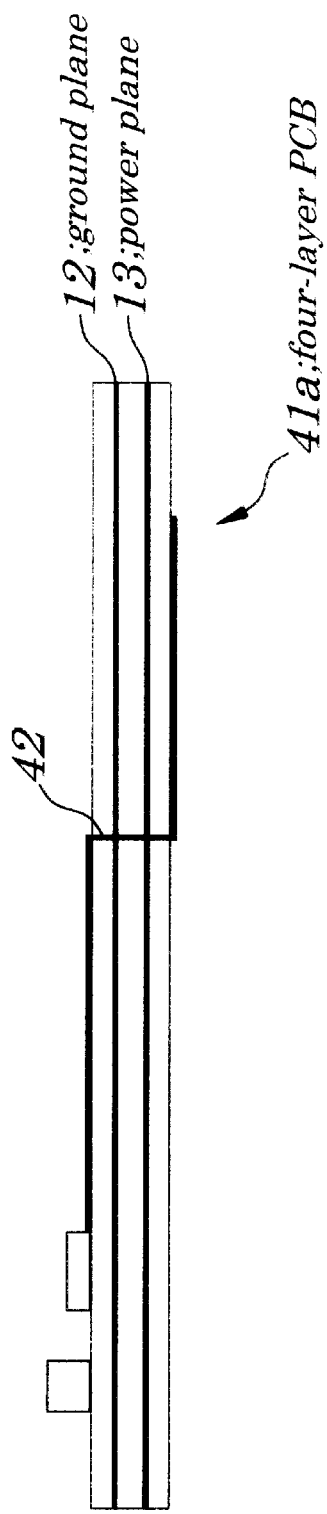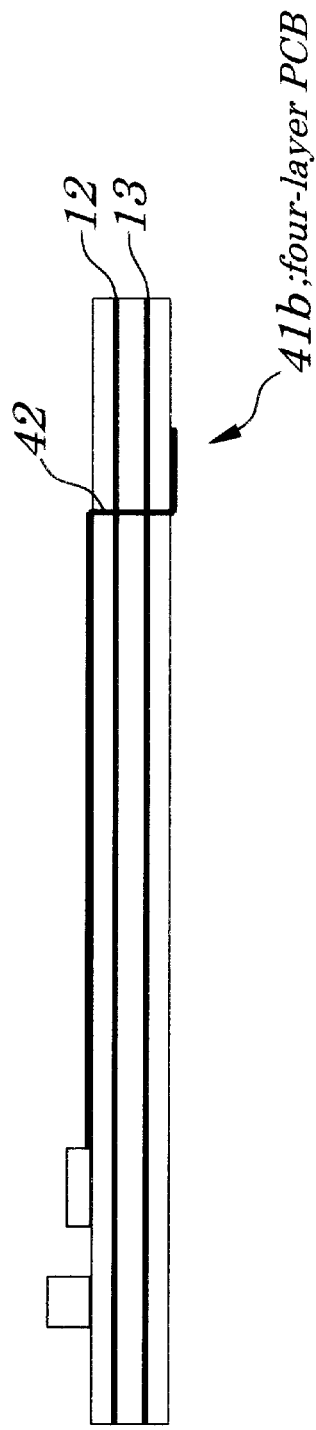
FIG.12A
FIG.12B position along PCB position along PCB

81; modified PCB design support system

233;calculation model expressed by equivalent circuit

FIG. 34 *(PRIOR ART)*
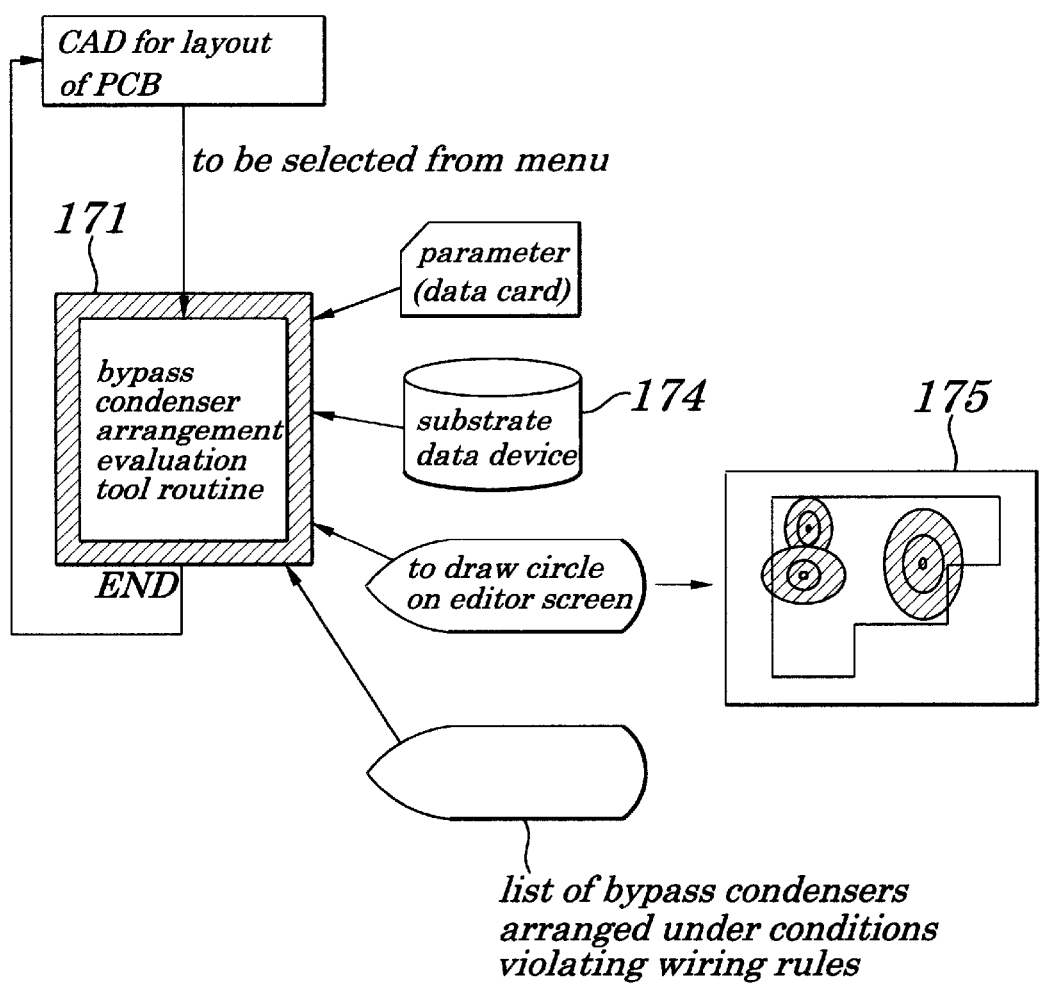

PRINTED CIRCUIT BOARD DESIGN SUPPORT SYSTEM, PRINTED CIRCUIT BOARD DESIGN METHOD AND STORAGE MEDIUM STORING CONTROL PROGRAM FOR SAME

BACKGROUND OF THE INVENTION

1. Field of the Invention

The present invention relates to a printed circuit board (hereinafter, simply referred to as PCB) design support system, a PCB design method and a storage medium storing a control program for a same and more particularly to the PCB design support system and PCB design method to reduce emission of unwanted electromagnetic waves caused by variations in voltages between a power plane and a ground plane on a multilayer PCB by controlling voltage variations, and an equivalent circuit model expressed by an equivalent circuit to implement the above system and method.

2. Description of the Related Art

A PCB is generally composed of electronic parts or elements such as ICs (Integrated Circuits), LSIs (Large Scale Integrated Circuits) or a like and of wirings used to connect these electronic parts or elements and is mounted on almost all electronic devices as their core portions. When an electronic circuit on a PCB is operated, a voltage is generated and a current flows, causing an electromagnetic wave to be emitted. As high-speed processing of signals becomes widespread, higher frequencies are increasingly used for circuit operations, which causes emission of unwanted electromagnetic waves in electronic devices, thus creating problems associated with electromagnetic interference in wireless communications, radio, TV or a like in environments surrounding such electronic devices. Therefore, VCCI (Voluntary Control Council for Interference by Information Technology Equipment in Japan) obliges manufacturers of electronic devices to reduce emission of unwanted electromagnetic waves from electronic devices to a controlled level or less.

It is well known that, in a multilayer PCB, a ground plane to provide a reference potential in circuits and a power plane to provide operating power to ICs and/or LSIs are, generally, of a plane structure and the ground plane and power plane function as parallel-plate lines and that variations in voltages between the power plane and ground plane causes emission of unwanted electromagnetic waves (refer to Transaction of the Institute of Electronics, Information and Communication Engineers, Vols. E-80-B, No.11, November 1997, p. 1645–1651). To reduce the emission of unwanted electromagnetic waves caused by variations in voltages between the power plane and ground plane, PCBs having various kinds of structures are introduced and various kinds of methods for designing the PCB are available accordingly.

One example of conventional technology is disclosed in Japanese Patent Application Laid-open No. Hei 11-145569 entitled "Printed Circuit Board and Method for Designing Same", in which, as shown in FIGS. 30A and 30B, a plurality of conductive patterns 102a and signal lines 105a both extending in a direction of length of a base material 101 are formed on a part-mounting surface of a rectangular and plate-like, base material 101. On a soldering surface disposed opposite to the part-mounting surface of the base material 101 is formed a plurality of conductive patterns 102b and signal lines 105b extending in a direction perpendicular to the direction of the length of the base material 101 as shown in FIG. 30B. The conductive patterns 102a and 102b are used as a power pattern or a ground pattern. Moreover, separated parts of the conductive patterns 102a and 102b are connected to each other via a chip-type resistor 104. By using this chip-type resistor 104, a decrease in impedance of the conductive patterns 102a and 102b occurring at a frequency of a standing wave generated from a relationship between a size of the base material 101 and a wavelength of radiation noise is suppressed by loss factor induced by the chip-type resistor 104, thus resulting in a decrease of a Q value (resonance frequency) in resonance of the standing wave, leading to reduction of emissions of unwanted electromagnetic waves.

Another example of the conventional technology is disclosed in Japanese Patent Application Laid-open No. Hei 11-40905 entitled "Printed Circuit Board and Electronic Device", in which, as shown in FIG. 31, the PCB 110 is composed of a power layer 111, a ground layer 112 and dielectrics 113a and 113b disposed between the power layer 111 and the ground layer 112. There ate mounted two kinds of dielectrics 113a and 113b each having a different dielectric constant and is configured so that their dielectric constants are in a distributed state on plane faces of the power layer 111 and the ground layer 112 to make resonance weak in a widely distributed state on an axis of frequencies by giving a different resonance condition to each point of the plane face, thus achieving reduction in emissions of strong unwanted electromagnetic waves at a specified frequency.

Moreover, another example of the conventional technology is disclosed in Japanese Patent Application Laid-open No. Hei 10-275981 entitled"Multilayer Printed Circuit Board", in which, as shown in FIG. 32, capacitors 124 adapted to cause high frequency current flowing in a power layer 122 to flow into a ground layer 123 are mounted on edge portions of the power layer 122 and of the ground layer 123 in continuous or discrete positions, thereby achieving reduction of emissions of unwanted electromagnetic waves from the multilayer PCB, having a signal layer 121, the power layer 122 and the ground layer 123.

Another example is disclosed in Japanese Patent Application Laid-open No. Hei 6-203102 entitled "Printed Circuit Board Wiring Method", in which, as shown in FIG. 33, each of blocks 132, 133, . . . , 143 are disposed on a multilayer PCB 131 in a manner that digital signals containing much higher frequency components can be sent or received in a straight-line manner in an X or Y direction among these blocks. In this method, therefore, by forbidding cut lines 161 and 162 disposed orthogonal to a direction of wirings to allow digital signals containing much higher frequency components to flow in regions overlapping other regions 151, 152 or 153 disposed adjacent respectively to a layer having wirings to allow digital signals containing much higher frequency components to flow among blocks mounted on a power layer and a ground layer (not shown), overlap each other, emissions of unwanted electromagnetic waves are reduced.

Furthermore, another example disclosed in the Japanese Patent Application Laid-open No. Hei 10-97560 entitled "Computer Aided Design System", in which, as shown in FIG. 34, by using a tool 171 for evaluation on an arrangement of a bypass condenser incorporated in the CAD (Computer Aided Design) system, parameters associated with a wiring path of the bypass condenser is determined based on information obtained through a substrate data device 174 required for layout of a PCB and then, based on an impedance characteristic calculated from determined parameters, a range of effectiveness that can be provided by the bypass condenser is determined. Parameters associated with the wiring path of the bypass condenser include a wiring length, resistivity, wiring width, wiring thickness or a like. The above tool 171 has a function to display determined range of effectiveness provided by the bypass condenser, which is approximated by an ellipse, on a display device 175. The CAD system, by using this function, designs the PCB in which emissions of unwanted electromagnetic waves are reduced.

However, each of the above examples of conventional technologies has a problem.

In technology disclosed in the Japanese Patent Application Laid-open No. Hei 11-145569 (FIG. 30A and FIG. 30B), though resonance occurring among wirings can be reduced by insertion of the resistor 104, since a voltage drop occurs due to the insertion of the resistor 104, it is impossible to reduce resonance in power lines. Therefore, the emissions of unwanted electromagnetic waves caused by variations in voltages between the power plane and the ground plane cannot be fully reduced. Moreover, in technology disclosed in the Japanese Patent Application Laid-open No. Hei 11-40905 (FIG. 31) use of two dielectrics, dielectrics 113a and 113b, each having different dielectric constant is required which causes complex structures of the PCB. Also, in technology disclosed in the Japanese Patent Application Laid-open No. Hei 10-275981 (FIG. 32), since a device to be inserted into the edge portion of the substrate is the capacitor 124 being a reactance device, though a resonance frequency between the power layer 111 and ground layer 112 is changed, resonance itself cannot be suppressed. That is, this technology is effective only when radiation of electromagnetic waves is affected by a shift in frequencies. Technology disclosed in the Japanese Patent Application Laid-open No. Hei 6-203102 (FIG. 33) is featured by having no discontinuous portion in a path for return currents in a signal wiring system. Therefore, though the emissions of unwanted electromagnetic waves from signal wiring system can be reduced, it is difficult to suppress the unwanted electromagnetic waves caused by variations in voltages between the power plane and ground plane. Furthermore, technology disclosed in the Japanese Patent Application Laid-open No. Hei 10-97560 (FIG. 34) is one which is required for determining the wiring path of the bypass condenser and which is effective in reducing variations in voltages between the power plane and ground plane caused by switching noise occurring in active elements such as LSIs, ICs or the like, however, it is not effective in reducing variations in voltages caused by an interlayer via-hole used to connect signal lines mounted between different layers and by coupled signal lines mounted in a layer put between the power plane and ground plane.

In order to shorten a development timescale for electronic devices on which the PCB is mounted, there is a strong demand for incorporating a measure to reduce emissions of unwanted electromagnetic waves from the PCB, in a precautionary manner, from a starting stage of designing the PCB. Moreover, to reduce costs of the PCB, a method for the reduction of the emissions of unwanted electromagnetic waves from the PCB by optimizing layout of the PCB while following conventional designing and circuit-arranging methods without using additional new parts or employing new specific wiring structures leading to increased costs, is needed.

SUMMARY OF THE INVENTION

In view of the above, it is an object of the present invention to provide a PCB design support system, a PCB design method capable of reducing radiation of electromagnetic waves by optimizing layout of a substrate while following a conventional method for designing the PCB and maintaining a conventional structure, and a storage medium storing a control program for a same.

According to a first aspect of the present invention, there is provided a PCB design support system including:

an inputting means to input information about ground plane structure, power plane structure and layout of a PCB including information about positions of mounting active elements such as LSIs, ICs or a like and at least one decoupling capacitor;

a section to build a circuit model expressed by an equivalent circuit for calculating, using the input information, voltage distribution between the ground plane and the power plane;

a section to select a specified frequency and to calculate voltage distribution occurring at the specified frequency between the ground plane and the power plane;

a section to display the calculated voltage distribution in a form of a two-dimensional voltage distribution map in a manner to correspond to a shape of the PCB; and a section to store results obtained from the above operations.

In the foregoing, a preferable mode is one wherein the section to display the voltage distribution puts the voltage distribution map on the PCB in a manner that they overlap each other and displays regions expressing voltage levels on the voltage distribution map in order of decreasing voltage strength and in stages.

Also, a preferable mode is one that wherein includes a section to partition regions of the voltage distribution map in order of decreasing voltage strength and in stages to classify the partitioned regions on the voltage distribution map into regions specified in stages in accordance voltage levels including one region where disposing of a via-hole straddling the ground plane and the power plane is prohibited and one region where disposing of the via-hole is allowed.

Also, a preferable mode is one wherein the section to calculate the voltage distribution calculates, instead of the voltage distribution, complex impedance between the ground plane and the power plane and displays absolute values of results of calculation.

Also, a preferable mode is one that wherein includes a section to extract a position of the via-hole straddling the ground plane and the power plane based on input information about signal wiring including layout information, a section to set the extracted position of the via-hole to the voltage distribution map of the calculated voltage distribution occurring between the ground plane and the power plane and/or to display the extracted position of the via-hole on the voltage distribution map and a section to issue a sign that gives warning to any said via-hole disposed in a region where a voltage is at a high level.

Also, a preferable mode is one that wherein includes a section to provide an instruction that a capacitor to connect the ground plane to the power plane is mounted near the via-hole formed so as to straddle the ground plane and the power plane and mounted in a region where a voltage is high.

Also, a preferable mode is one that wherein includes a section to find out and specify a region having a lower voltage to which any via-hole given the sign that gives warning is able to be moved and/or to instruct the PCB design support system to automatically move the via-hole given the sign that gives warning to the low-voltage region.

According to a second aspect of the present invention, there is provided a method of designing a PCB including steps of:

an inputting means to input information;

inputting information about ground plane structure, power plane structure and layout of a PCB including information about positions of mounting active elements such as LSIs, ICs or a like and at least one decoupling capacitor;

building a circuit model expressed by an equivalent circuit, using input information, to calculate voltage distribution between the ground and the power plane;

selecting a specified frequency and calculating voltage distribution occurring at the specified frequency between the ground plane and the power plane;

displaying obtained voltage distribution in a form of a two-dimensional voltage distribution map in a manner to correspond to a shape of the PCB; and deciding, using the voltage distribution map, a position of disposing a via-hole for signal wiring which straddles the ground plane and the power plane.

According to a third aspect of the present invention, there is provided a PCB support system including:

a section to input information about ground plane structure, power plane structure and layout of a PCB including information about positions of mounting active elements such as LSIs, ICs or a like and at least one decoupling capacitor;

a section to build a circuit model for calculating, using the input information, distribution of currents flowing on both the ground plane and the power plane;

a section to select a specified frequency and to calculate distribution of currents flowing, at the specified frequency, in two directions in a manner being parallel to ends of the ground plane and the power plane, on both the ground plane and the power plane;

a section to display separately each of the current distributions obtained in the two current flowing directions in a form of a two-dimensional current distribution map in a manner to correspond to a shape of the PCB; and a section to store results obtained from operations.

In the foregoing, a preferable mode is one wherein the section to display the current distribution puts the current distribution map on the PCB in a manner that they overlap each other and displays regions expressing current levels on the current distribution map in order of decreasing current strength and in stages, separately for each of current distributions obtained in the two current flowing directions.

Also, a preferable mode is one that wherein includes a section to partition regions of each of the current distribution maps obtained in the two current flowing directions in order of decreasing current strength and in stages to classify the partitioned regions on the current distribution map into regions specified in stages in accordance current levels including one region where installation of wiring in a same direction as for current flowing direction in a layer disposed between the ground plane and the power plane is prohibited and one region where the installation of wiring is allowed.

Also, a preferable mode is one that wherein includes a section to extract a position of the wiring installed in the layer disposed between the ground plane and the power plane based on input information about signal wiring including layout information, a section to set the extracted position of the wiring installed in the layer to each of the current distribution maps of the calculated current distributions obtained in the two current flowing directions between the ground plane and the power plane and/or to display the extracted position of the wiring on the current distribution map and a section to issue a sign that gives warning to any wiring installed in the same direction as for current flowing direction in the layer disposed between the ground plane and the power plane and disposed in a region where a current is at a high level.

Also, a preferable mode is one that wherein includes a section to find out and specify a region where the current flowing on both ground plane and the power plane is at a low level, to which the wiring given the sign that gives warning is able to be moved for installation and/or to instruct the PCB design support system to automatically move the wiring given the sign that gives warning to the low-current region.

According to a fourth aspect of the present invention, there is provided a method of designing a PCB including steps of:

inputting information about ground plane structure, power plane structure and layout of a PCB including information about positions of mounting active elements such as LSIs, ICs or a like and at least one decoupling capacitor; building a circuit model for calculating, using input information, currents flowing on both the ground plane and the power plane;

selecting a specified frequency and calculating distribution of current flowing in two directions in a manner being parallel to ends of the ground plane and power plane, at the specified frequency, on both the ground plane and the power plane;

displaying separately each of current distributions obtained in the two current flowing directions in a form of a two-dimensional current distribution map in a manner to correspond to a shape of the PCB; and deciding, using a current distribution map, a position of installing wiring in a layer put between the ground plane and the power plane.

Also, according to a fifth aspect of the present invention, there is provided a machine-readable storage medium storing a control program used for designing a PCB, wherein the control program causes a computer to carry out steps of:

inputting information about ground plane structure, power plane structure and layout, of a PCB including information about positions of mounting active elements such as LSIs, ICs or a like and at least one decoupling capacitor, building a circuit model for calculating, using input information, voltage distribution between the ground plane and the power plane, selecting a specified frequency and of calculating voltage distribution occurring at the specified frequency between the ground plane and the power plane, displaying obtained voltage distribution in a form of a two-dimensional voltage distribution map in a manner to correspond to a shape of the PCB, and deciding, using the voltage distribution map, a position of disposing a via-hole formed in a manner to straddle the ground plane and the power plane.

Also, according to a sixth aspect of the present invention, there is provided a machine-readable storage medium storing a control program used for designing a PCB, wherein the control program causes a computer to carry out steps of:

inputting information about ground plane structure, power plane structure and layout of a PCB including information about positions of mounting active elements such as LSIs, ICs or a like and at least one decoupling capacitor, building a circuit model for calculating, using the input information, distribution of currents flowing on both the ground plane and the power plane, a step of selecting a specified frequency and calculating distribution of currents flowing, at the specified frequency, in two directions in a manner being parallel to ends of the ground plane and the power plane, on both the ground plane and the power plane, displaying separately obtained two current distributions obtained in two current flowing directions in a form of a two-dimensional current distribution map in a manner to correspond to a shape of the PCB, and deciding, by using the current distribution map, a position of installing wiring in a layer put between the ground plane and the power plane.

According to a seventh aspect of the present invention, there is provided a equivalent circuit model expressed by an equivalent circuit for supporting design of a PCB to calculate distribution of voltages between a ground plane and a power plane, distribution of currents flowing on the ground plane and the power plane and complex impedance between the ground plane and the power plane including an equivalent circuit in which both the ground plane and the power plane are expressed by a capacitor, an inductor and a resistor and the resistor is connected in parallel to the capacitor to express dielectric loss by a dielectric contained in the PCB.

In the foregoing, it is preferable that a resistor is connected to ends of the equivalent circuit to express radiation loss caused by an emission of electromagnetic wave.

According to an eighth aspect of the present invention, there is provided a PCB design support system provided with a control program for designing a PCB, wherein the control program causes a computer to carry out steps of:

inputting information about ground plane structure, power plane structure and layout of a PCB including information about positions of mounting active elements and at least one decoupling capacitor;

building a circuit model for calculating, using input the information, voltage distribution between the ground plane and the power plane;

selecting a specified frequency and of calculating voltage distribution occurring at the specified frequency between the ground plane and the power plane;

displaying the obtained voltage distribution in a form of a two-dimensional voltage distribution map in a manner to correspond to a shape of the PCB; and deciding, using the voltage distribution map, a position of disposing a via-hole formed in a manner to straddle the ground plane and the power plane.

According to a ninth aspect of the present invention, there is provided a PCB design support system provided with a a control program for designing a PCB, wherein the control program causes a computer to carry out steps of:

inputting information about ground plane structure, power plane structure and layout of a PCB including information about positions of mounting active elements such as LSIs, ICs or a like and at least one decoupling capacitor;

building a circuit model for calculating, using input the information, distribution of currents flowing on both the ground plane and the power plane;

selecting a specified frequency and calculating distribution of currents flowing, at the specified frequency, in two directions in a manner being parallel to ends of the ground plane and the power plane, on both the ground plane and the power plane;

displaying separately the obtained two current distributions obtained in the two current flowing directions in a form of a two-dimensional current distribution map in a manner to correspond to a shape of the PCB; and deciding, by using the current distribution map, a position of installing wiring in a layer disposed between the ground plane and the power plane.

BRIEF DESCRIPTION OF THE DRAWINGS

The above and other objects, advantages and features of the present invention will be more apparent from the following description taken in conjunction with the accompanying drawings in which:

FIGS. 12A and 12B show cross-sectional views of two four-layer PCBs in which the via-hole straddles both the power plane and ground plane to explain positional dependency in variations in voltages on the four-layer PCB according to the first embodiment of the present invention;

FIG. 34 is a diagram showing a computer aided design system for another PCB in accordance with conventional technology.

DETAILED DESCRIPTION OF THE PREFERRED EMBODIMENTS

Best modes of carrying out the present invention will be described in further detail using various embodiments with reference to the accompanying drawings.

First Embodiment

Figure 1:
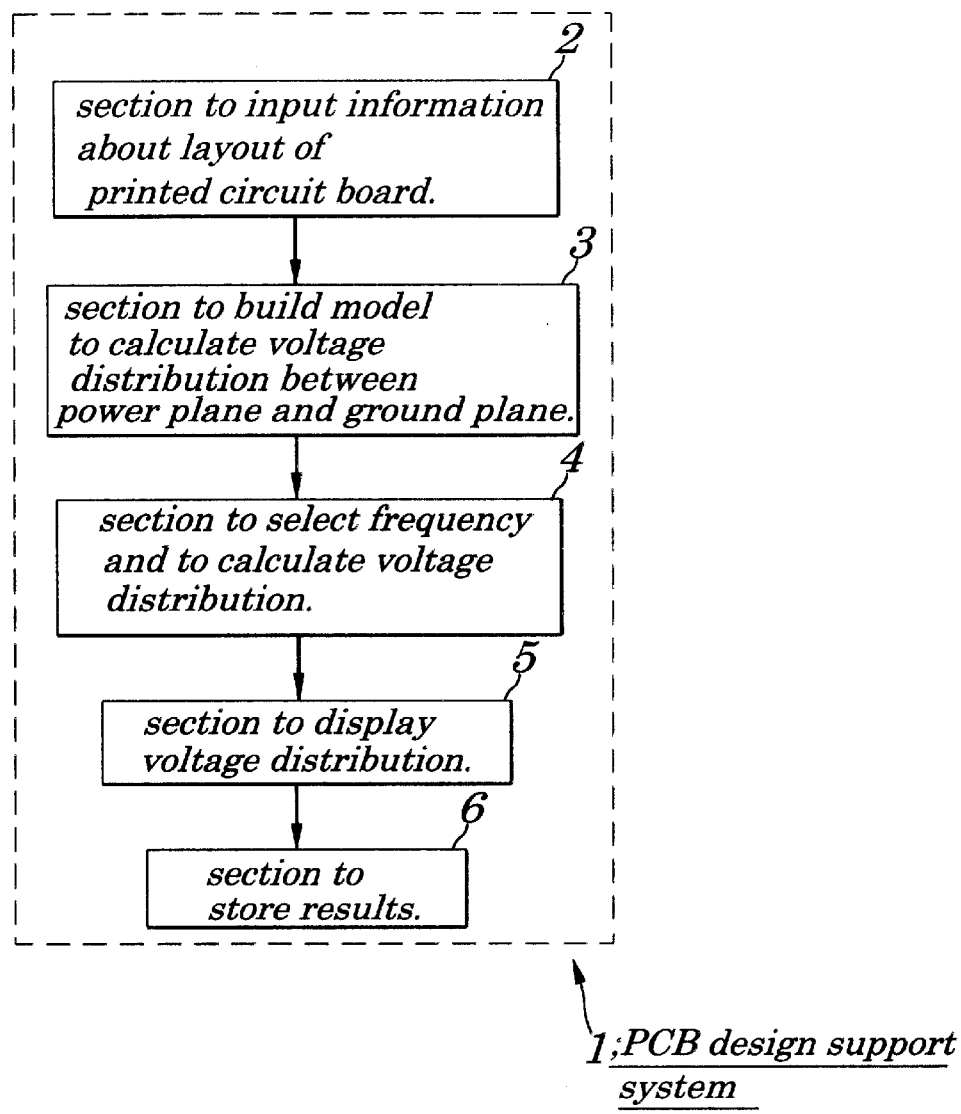
FIG. 1 is a schematic block diagram showing a PCB design support system according to a first embodiment of the present invention.

FIG. 1 is a schematic block diagram showing a PCB design support system (apparatus) according to a first embodiment of the present invention. A PCB design support system 1 is composed of a section 2 to input information about ground plane structure, power plane structure and layout of a PCB including information about positions of mounting active elements such as LSIs, ICs or a like and at least one decoupling capacitor, a section 3 to build a calculation model for calculating a voltage distribution between the power plane and ground plane using the input information, a section 4 to select a specified frequency and to calculate the voltage distribution occurring at the selected frequency between the power plane and the ground plane, a section 5 to display the obtained voltage distribution in a format of a two-dimensional voltage distribution map in a manner to correspond to a shape of the PCB and a section 6 to store results from above operations.

In the embodiments according to the present embodiment, at least one of the above sections may be a program causing a computer to carry out the function. The program may be stored a machine-readable storage such as a CD disk or a like.

Each component included in the PCB design support system 1 and its operation will be described in detail below.

Figure 2:
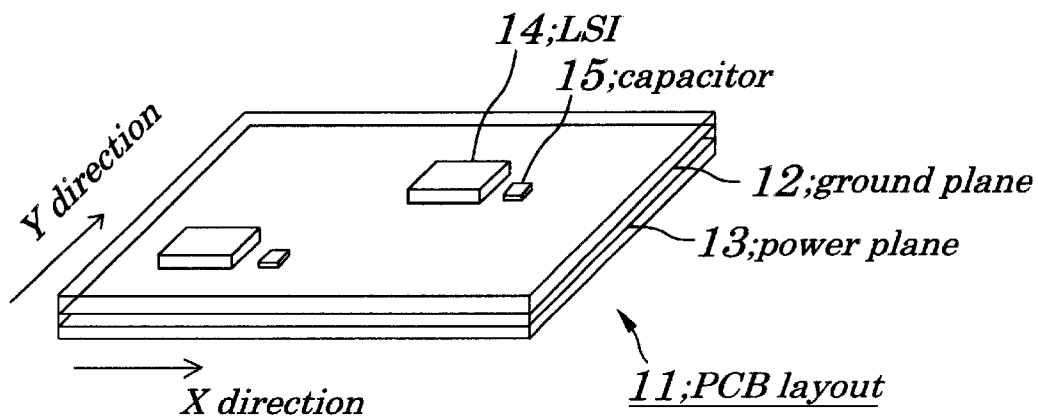
FIG. 2 is a perspective view of a multilayer PCB implemented according to the first embodiment of the present invention.
Figure 3:
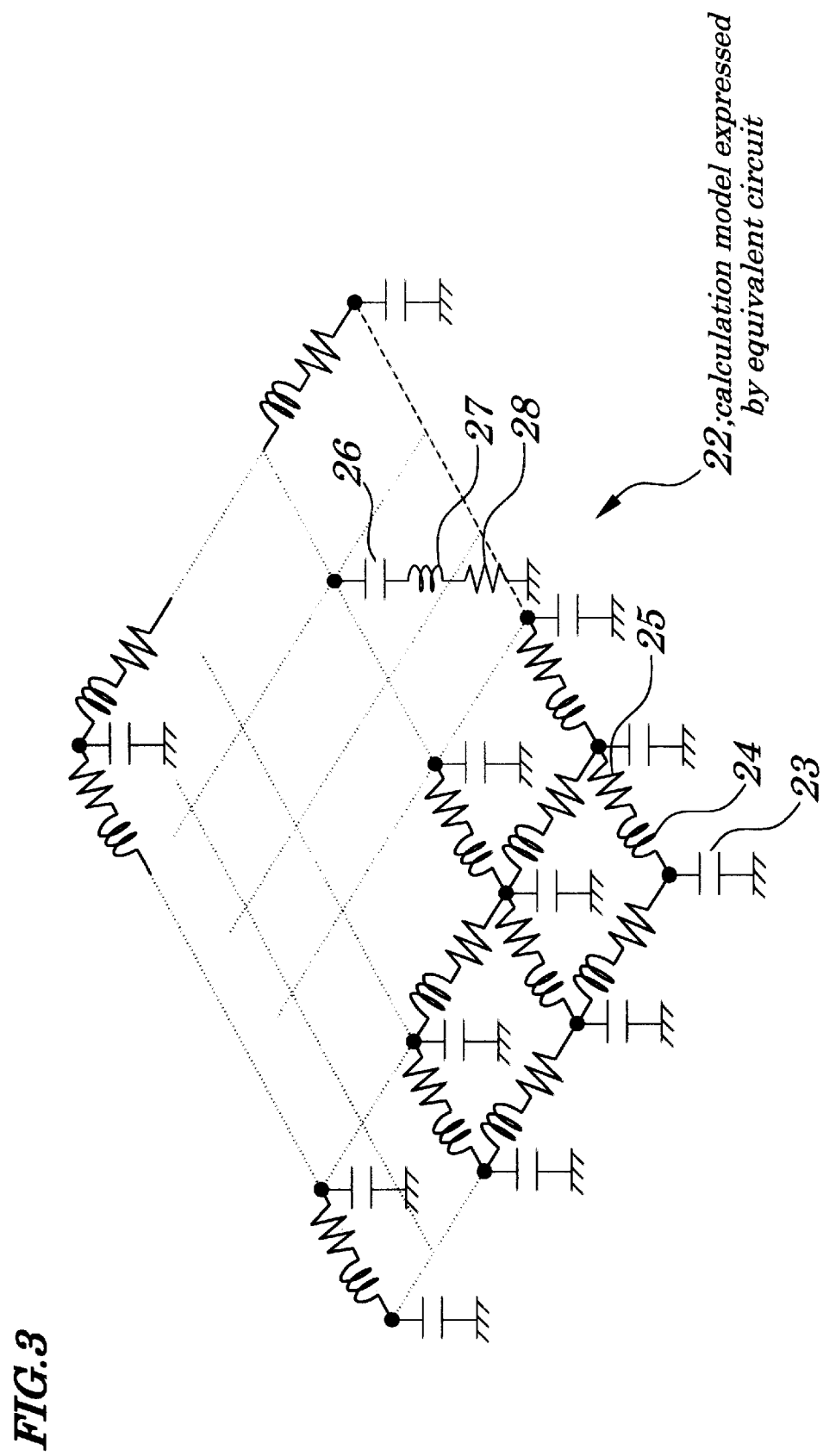
FIG. 3 is a diagram showing a calculation model expressed by an equivalent circuit of a power supply system composed of a power plane and a ground plane, implemented according to the first embodiment of the present invention.

In a PCB layout information inputting section 2(FIG. 1), as shown in FIG. 2, information about positions of mounting active elements including a ground plane 12, a power plane 13, an LSI and/or IC 14 or a like and of a coupling capacitor 15 or a like is input to produce a PCB layout 11 in which signal lines are excluded. In the section 3, a calculation model 22, expressed by an equivalent circuit as shown in FIG. 3, in a power supply system composed of the power plane 13 and the ground plane 12 in which the power plane 13 and the ground plane 12 are regarded as parallel-plate lines, is built based on information of the PCB layout 11 obtained in the section 2.

In the first embodiment, it is presumed that a SPICE (Simulation Program with Integrated Circuit Emphasis) being a circuit simulator is used for the calculation of voltage distribution. The calculation model 22 is expressed by the equivalent circuit composed of concentrated constant circuit elements including a capacitor 23, an inductor 24 and a resistor 25. As additional method for calculating the voltage distribution, methods of electromagnetic field analysis including a transmission line analysis method, a Moment method and/or an FDTD (Finite-Difference Time-Domain) method are used, and a model that can be suitable to each calculation method is built.

Procedures for building the calculation model 22 will be described by referring to a flowchart shown in FIG. 4 and by taking a case as an example in which voltage distribution is calculated by using the calculation model 22 expressed by the equivalent circuit described above. (To build the calculation model 22 expressed by the equivalent circuit as shown in FIG. 3, technology reported in "IEEE Transaction on Component, Packing and Manufacturing Technology", Part B. Vol. 18, No.4, pp. 628–639, November 1995, can be used.)

Figure 4:
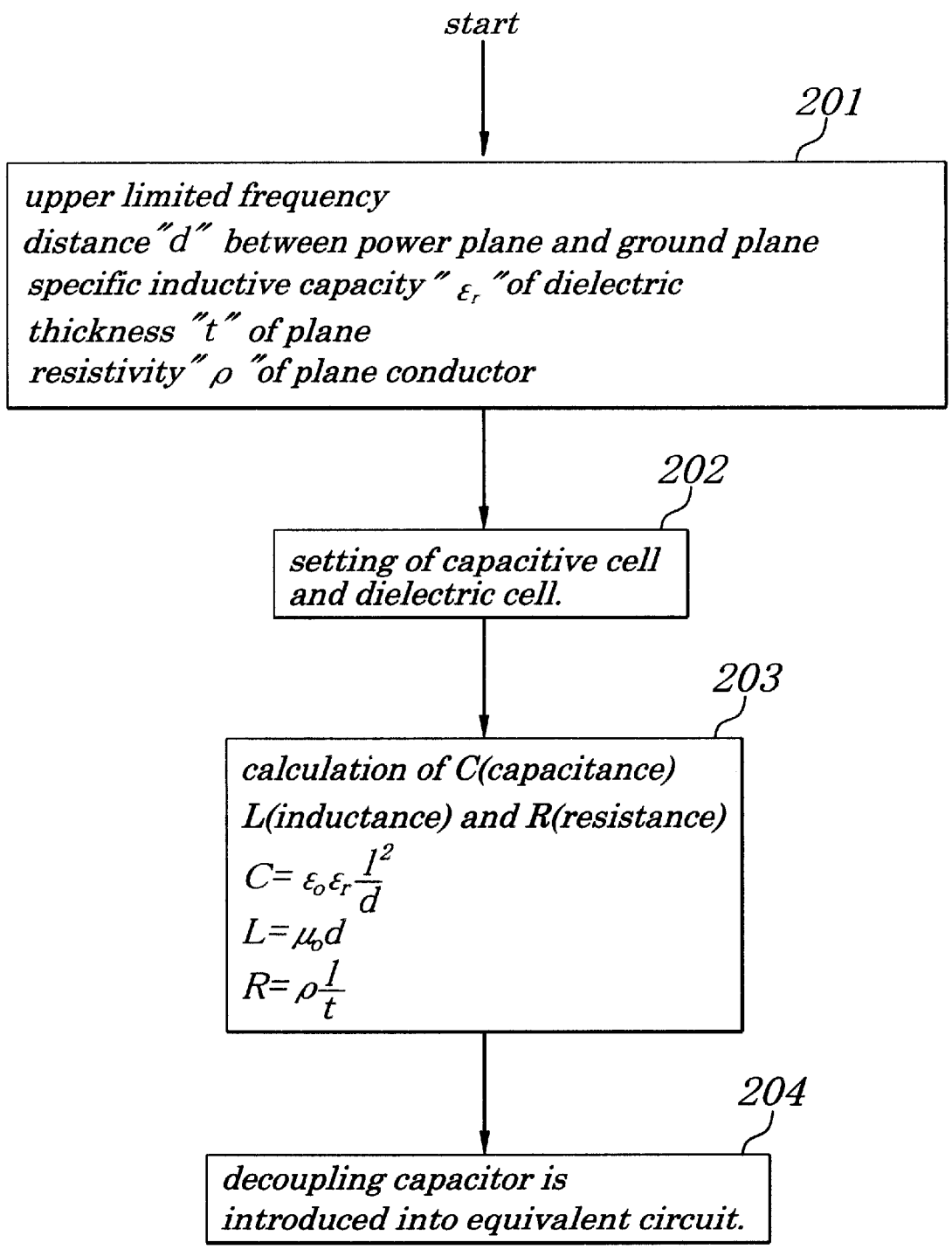
FIG. 4 is a flowchart explaining procedures for building the calculation model expressed by the equivalent circuit of the power supply system composed of the power plane and the ground plane, implemented according to the first embodiment of the present invention.
Figure 5:
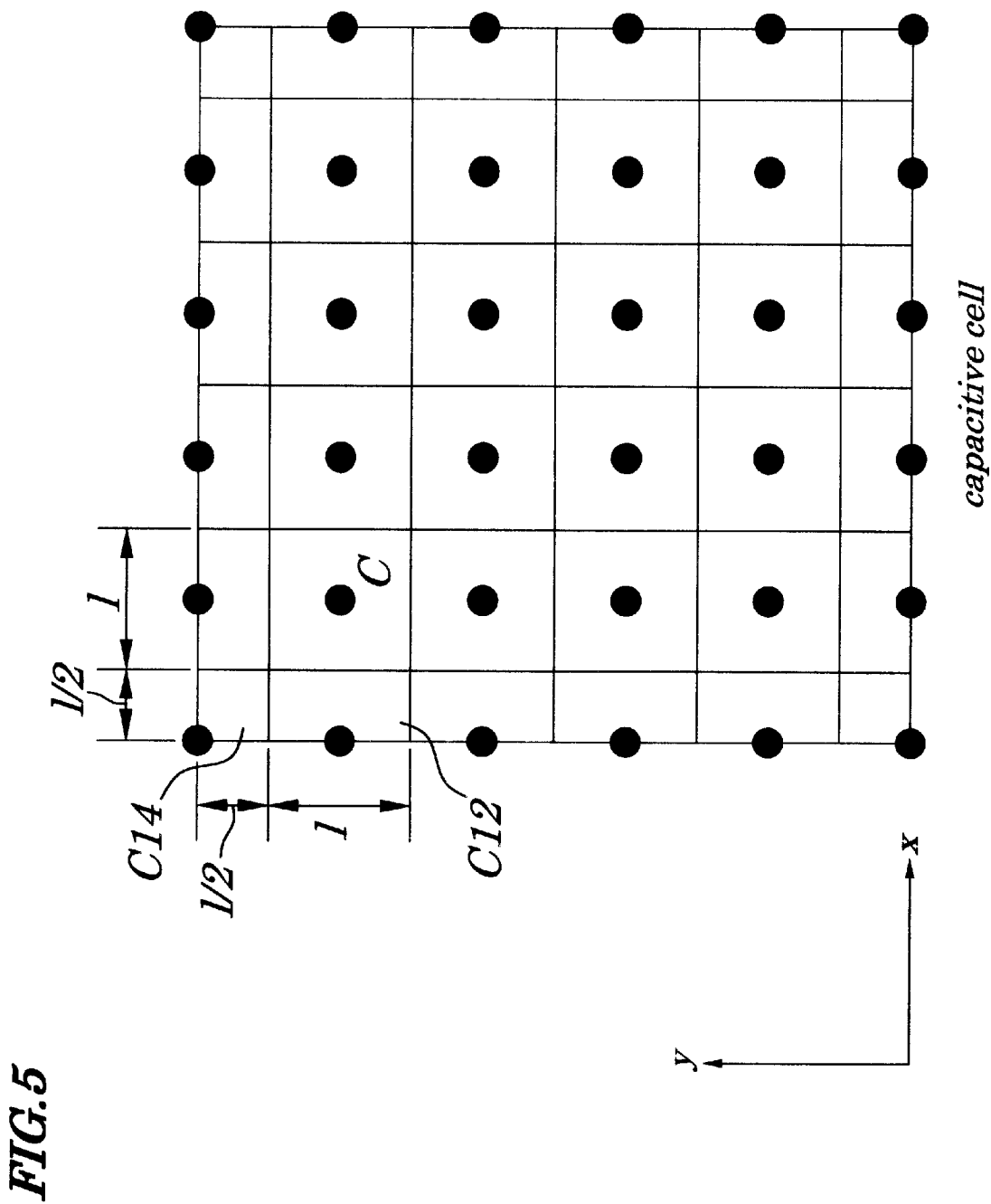
FIG. 5 is a diagram of an entire region of the power plane and ground plane represented by capacitive cells according to the first embodiment of the present invention.
Figure 6B:
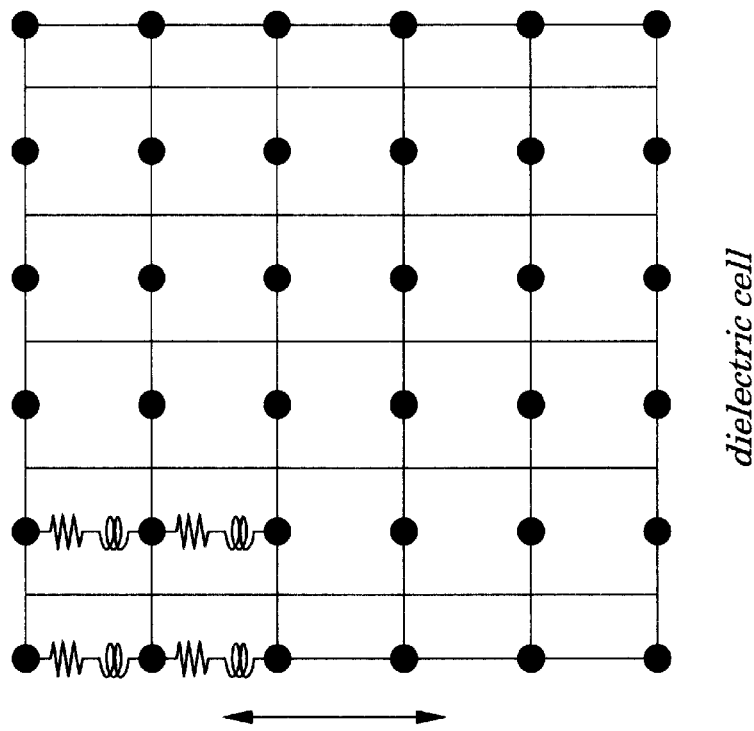
FIGS. 6A and 6B are diagrams of an entire region of the power plane and ground plane represented by dielectric cells according to the first embodiment of the present invention.
Figure 6A:
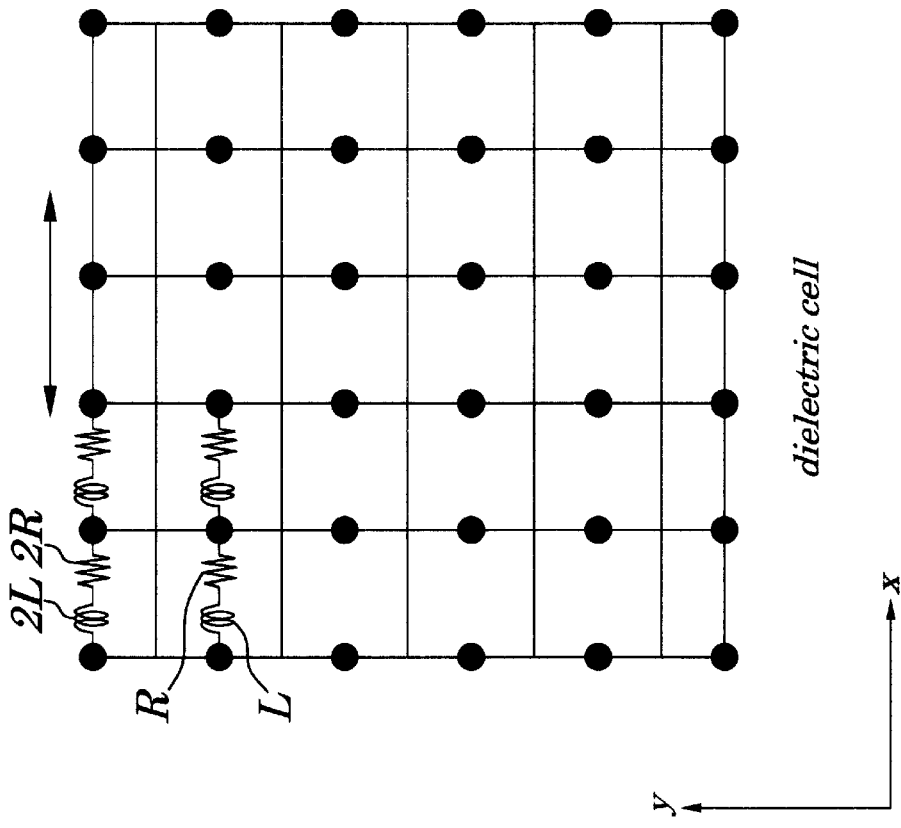

In FIG. 4 first, a distance "d" between the power plane and the ground plane, a specific inductive capacity "∈r" of a dielectric that makes up a substrate, a thickness of the plane "t", a resistivity "ρ" of a material that makes up the power plane and the ground plane and an upper limited frequency within a frequency band to be analyzed are input based on information about layout to be analyzed (Step 201). Since the upper limited frequency of an unwanted electromagnetic wave presently stipulated in, "Unwanted Electromagnetic Wave Standards" set b CISPR (International Special Committee on Radio Interference) is 1000 MHz, this upper limited frequency is applied in the above procedure. Capacitive cells are produced by dividing an entire region of the power plane and the ground plane into regions each being composed of a square whose side is l as shown in FIG. 5 and dielectric cells are produced also by dividing the entire region of the power plane and the ground plane into regions each being composed of a square whose side is l as shown in FIGS. 6A and 6B (Step 202). Dimensions of each of the capacitive cells and dielectric cells are same, however, the capacitive cell and dielectric cell are disposed from each other out of position by a half of a cell. The dielectric cell is composed of two kinds of cells; one is an X-axis cell corresponding to currents flowing in an X-axis direction as shown FIG. 6B and an other is a Y-axis cell corresponding to currents flowing in the Y-axis direction as shown FIG. 6A. Length of the side l is not more than one-half a wavelength of an electromagnetic wave having the frequency to be stipulated to be the upper limited frequency described above. That is, in the example, since the wavelength of the electromagnetic wave having the frequency stipulated to be the upper limited frequency is 0.3 m, the length of the side l should be l<0.015 m.

At this point, a size of a cell positioned along four sides of the square is one-half or one-fourth that of an internal cell. A point shown in each cell corresponds to a contact point (node) among circuits or elements in the calculation model 22 expressed by the equivalent circuit shown in FIG. 3. Capacitance C of the capacitor 23, inductance L of the inductor 24 and resistance R of the resistor 25 shown in FIG. 3 can be calculated by using equations provided in Step 203 in FIG. 4 (Step 203). In the equation, "∈$_0$" is a dielectric constant in a vacuum, "μ$_0$" is a permeability in a vacuum and"t" is a thickness of a plane. As a frequency becomes higher, a surface thickness "ds" is decreased. If the surface thickness "ds" is smaller than the plane thickness "t", the surface thickness "ds" is used instead of the plane thickness "t". Each point formed by four sides has capacitance C/2 and C/4, inductance 2L and resistance 2R.

In the two-dimensional model expressed by the equivalent circuit including LCR (Inductance, Capacitance and Resistance) created by the above procedures, a decoupling capacitor and a serial circuit composed of a parasitic inductor and a parasitic resistor are connected to a point positioned between a node and ground, which corresponds to a place for mounting the decoupling capacitor determined by PCB layout information obtained in the procedure (Step 204).

If calculation for analysis on the emission of electromagnetic waves is performed by using a transmission line theory, a model is built by regarding the power plane and the ground plane as parallel-plate lines. Moreover, if methods of analysis on electromagnetic waves such as the FDTD method or the Moment method are used, a model is built in which data on structure of the substrate is used, in a discrete manner, for an electric field calculation point and for a magnetic field calculation point or in which the power plane and the ground plane are separated to generate a network-like form and each of produced lattices is partitioned into current elements. Moreover, since each of elements contained in the PCB can be represented by the equivalent circuit, calculation method by circuit analysis using the model expressed by the equivalent circuit representing characteristics of the power plane and ground plane is particularly preferable. A model that can provide more accuracy than the calculation model 22 expressed by the equivalent circuit shown in FIG. 3 is available, which is described later.

Figure 7:
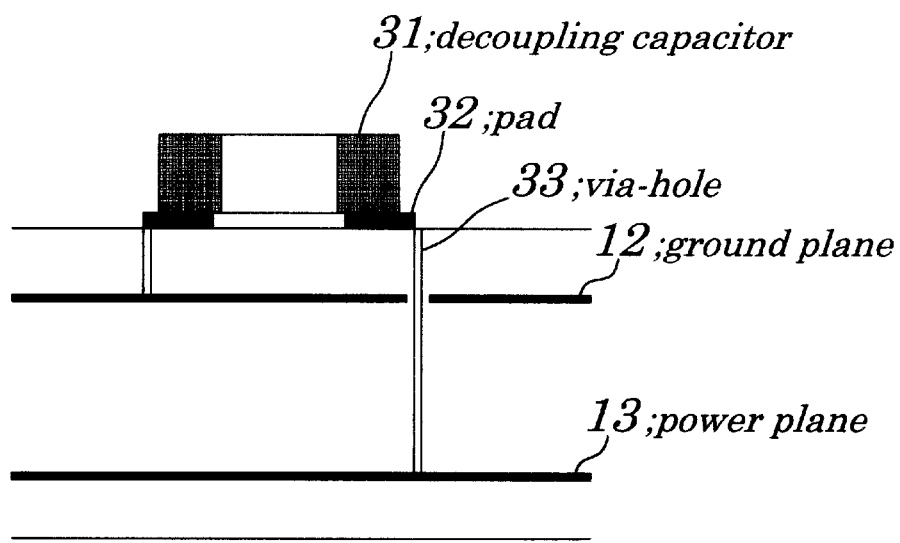
FIG. 7 is a cross-sectional view of a four-layer PCB at a place where a decoupling capacitor is mounted according to the first embodiment of the present invention.

In the calculation model 22 expressed by the equivalent circuit shown in FIG. 3, capacitor 23 is used to express a capacitive component, inductor 24 to express an inductance component and resistor 25 to express a conductor loss in each element obtained by dividing both the power plane 13 and the ground plane 12. In FIG. 3, a capacitor 26 is used to express a capacitive component of a decoupling capacitor 31 mounted to connect the power plane to the ground plane, as shown in FIG. 7, an inductor 27 to express inductance component of a pad 32 used to mount the decoupling capacitor 31 and of a via-hole 33 used to connect the pad 32 to the ground plane 12 and the power plane 13 and a resistor 28 to express a resistance component, in a form of concentrated constant circuit elements.

Figure 8:
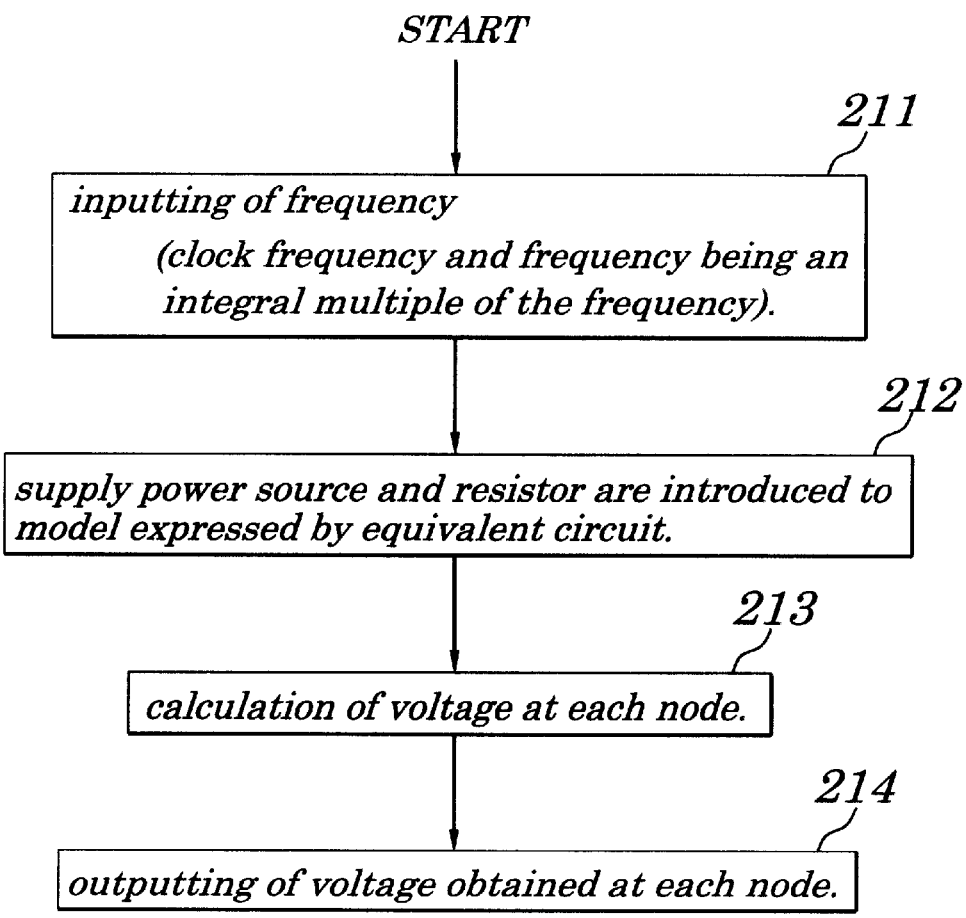
FIG. 8 is a flowchart explaining calculation procedures by a section to select frequencies and to calculate voltage distribution included in the PCB design support system according to the first embodiment of the present invention.

Then, frequencies associated with the equivalent circuit, for example, a clock frequency and a frequency being an integral multiple of the clock frequency are selected by using section 4 to select a specified frequency and to calculate voltage distribution and voltage distribution occurring at the selected frequency is calculated by using a calculation method in accordance with the calculation model 22 described above. Procedures for calculating the voltage distribution will be described by referring to a flowchart shown in FIG. 8 and taking, as an example, a case of calculating using the calculation model 22 shown in FIG. 3.

First, a frequency to be analyzed is selected (Step 211).

Generally, in a PCB, emission of electromagnetic waves occurs at a frequency being an integral multiple of a clock frequency. Therefore, the clock frequency and the frequency being an integral multiple of the clock frequency are selected and input. Moreover, a function to directly read these frequencies from information about specifications of the PCB may be introduced.

Figure 9:
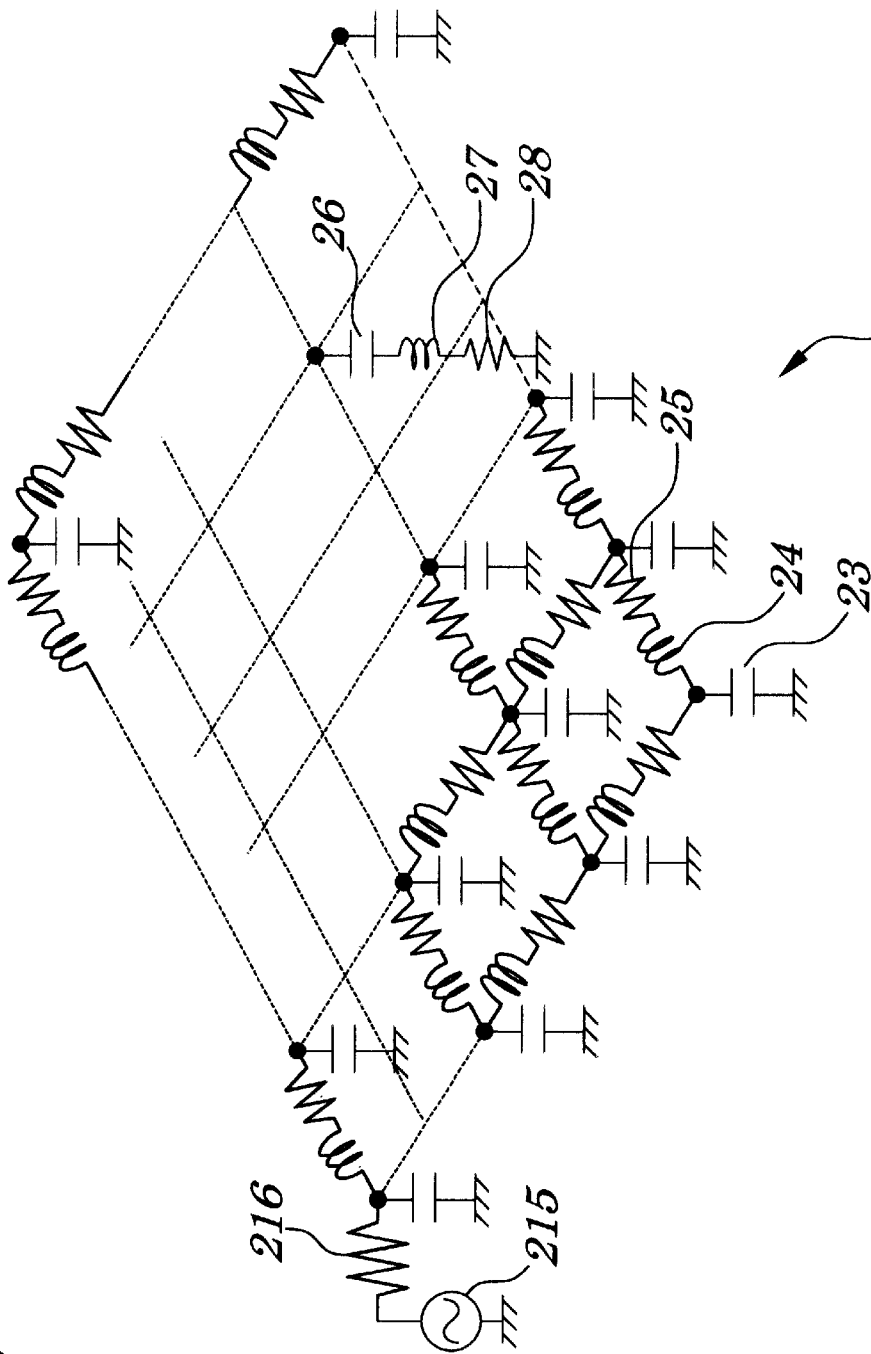
FIG. 9 shows a calculation model expressed by an equivalent circuit to be used in the calculation procedures shown in FIG. 8.
Figure 10:
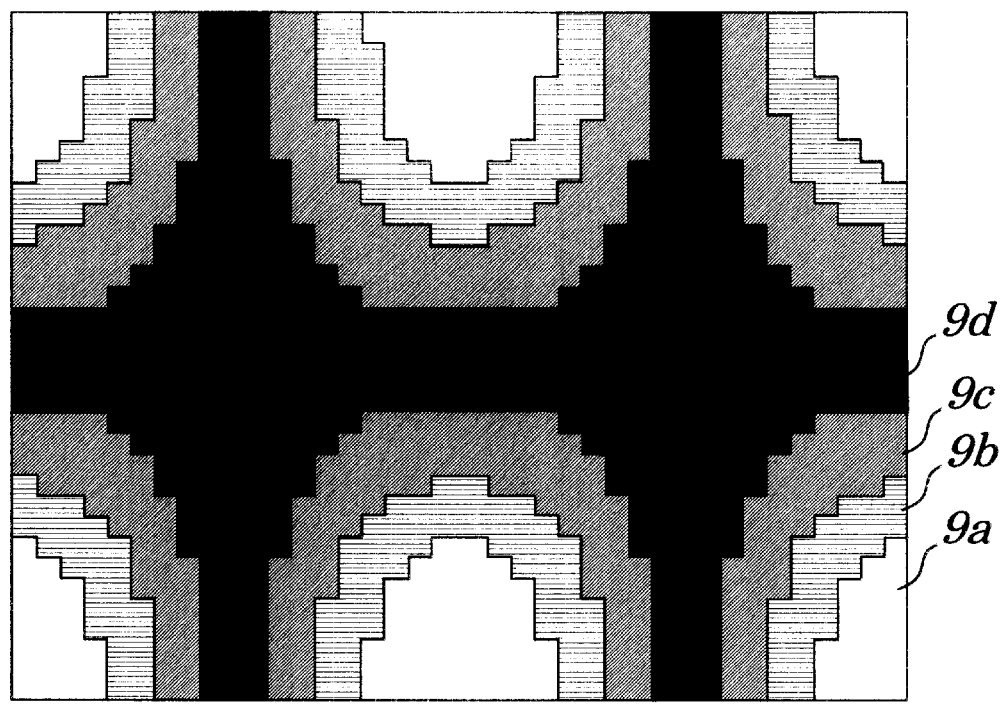
FIG. 10 shows a map of voltage distribution between the power plane and the ground plane obtained according to the first embodiment of the present invention.

Next, as shown in a model expressed by an equivalent circuit in FIG. 9, a power supply source 215 connected to a resistor 216 are introduced and the entire circuit is driven (Step 212) at the selected frequency and a voltage at each node is calculated (Step 213). The voltage distribution always reaches its peak at each of four corners of the substrate serving as opening ends. Therefore, preferably, a node corresponding to each of the four corners of substrate is driven (or a node corresponding to a place where active elements such as LSIs are mounted is preferably driven). The power supply source 215 having an infinite internal resistance may be connected. Finally, the voltage obtained at each node is output (Step 214). The circuit simulator such as the SPICE or like can be used for calculation using the calculation model 22 expressed by the equivalent circuit. A map of the voltage distribution shown in FIG. 10, which shows a result from the above calculation, is put on the PCB so that they overlap each other and regions expressing voltage levels are displayed on the map in order of decreasing voltage strength and in stages, that is, a region 9a has a higher voltage and a region 9b has a less higher voltage and so on. In FIG. 10, the voltage is highest in the region 9a displayed in white, second highest in the region 9b indicated by horizontal lines, third highest in a region 9c drawn with slants and a lowest in a region 9d displayed in black. This format of displaying the voltage strength is also applied to other drawings.

Reasons why the PCB design support system 1 of the present invention is effective in designing the PCB in which the emission of unwanted electromagnetic waves can be reduced are explained below. Generally, in a multilayer PCB, both a ground plane to provide a reference potential and a power plane to provide power to active elements such as ICs, LSI or a like are mounted as internal layers and other layers including a surface layer are used mainly for signal wiring. An example in a four-layer PCB 34 is shown in FIG. 11, in which a first layer 37 and a fourth layer 38, both being surface layers, are used for mounting parts and clock signal lines and/or data signal lines and a second layer and a third layer, both being internal layers, is used as the ground plane 12 and the power plane 13.

A pulse-like current generated at a time of switching operations of ICs and/or LSIs causes variations in power voltages between the power plane 13 and the ground plane 12 and voltage propagated to ends of a substrate emits unwanted electromagnetic waves. To reduce variations in voltages occurring at the time of switching operations, various types of power decoupling circuits are proposed (for example, ones disclosed in the Japanese Patent Applications Laid-open Nos. Hei 10-303568 and Hei 10-184469).

Figure 11:
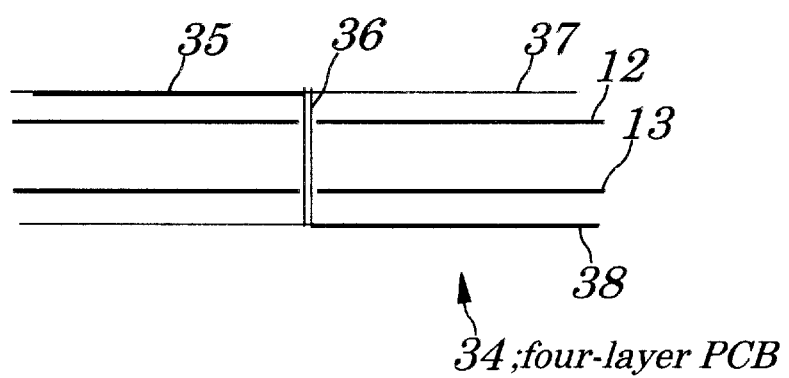
FIG. 11 is a cross-sectional view of a four-layer PCB showing a place near a via-hole disposed so as to straddle the power plane and ground plane according to the first embodiment of the present invention.

The inventors of the present application have found that such variations in voltages are caused not only by switching operations for active elements including LSIs, ICs or the like but also by existence of a via-hole 36, as shown in FIG. 11, which is mounted in a layer put between the ground plane 12 and power plane 13 in a manner to straddle the ground plane 12 and the power plane 13 to establish connection among wirings on the first layer 37 and on the fourth layer 38 and that a degree to which the voltage is varied, that is, to which the unwanted electromagnetic wave is emitted depends on a position of the via-hole 36.

Figure 13A:
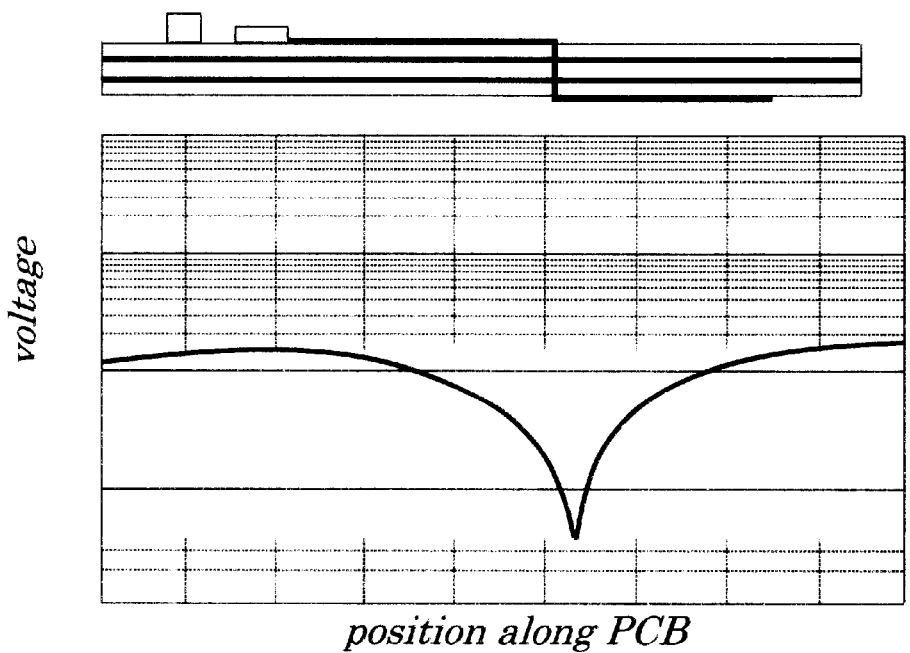
FIGS. 13A and 13B are diagrams showing distribution of voltages between the power plane and ground plane to explain positional dependency in variations in voltages on the PCB according to the first embodiment of the present invention.
Figure 13B:
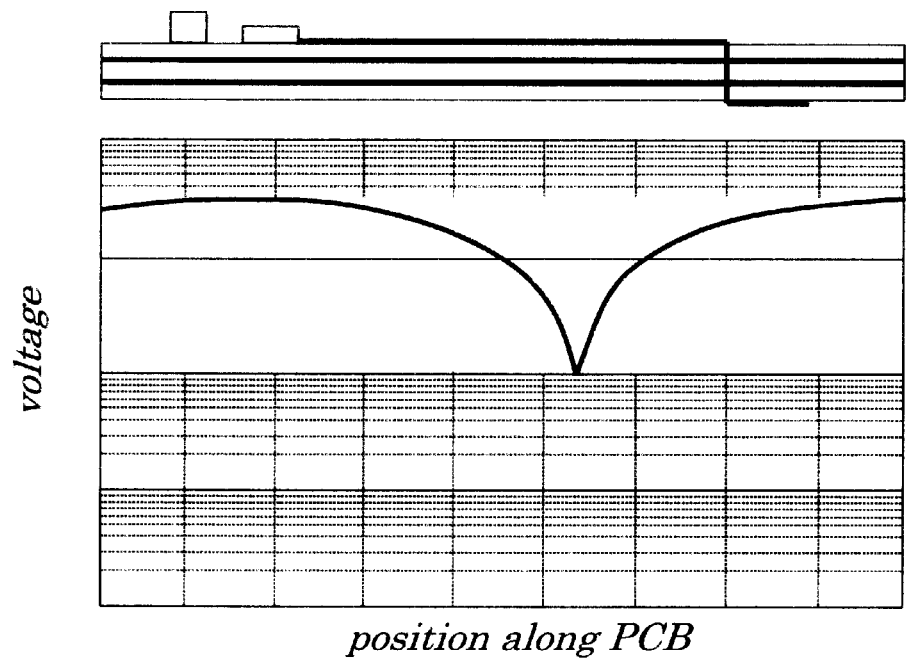

Detailed investigation of dependency on the position of the via-hole 36 has revealed that two-dimensional lines are formed of plane plates composed of the power plane 13 and the ground plane 12 in which standing waves are generated causing the voltage distribution to occur and that great variations in voltages occur if the via-hole 36 is positioned at a place where the voltage becomes higher, that is, in vicinity of a place where a crest of the standing wave exists. For example, in FIGS. 12A and 12B showing cross-sectional views of two four-layer PCBs 41a and 41b in which via-holes 42 straddle both the power plane 13 and the ground plane 12, interlayer wirings are provided in both PCBs. In the PCB 41a, the via-hole 42 for interlayer wiring is disposed at a place near to a center of the PCB 41a. In the PCB 41b, the via-hole 42 for interlayer wiring is disposed at a place near to an end of the PCB41b. FIG. 13A is a diagram showing distribution of voltages between the power plane 13 and the ground plane 12 measured along a direction of length of the PCB 41a at a resonance frequency 474 MHz in the example) of a line composed of both the power plane 13 and the ground plane 12. FIG. 13B is a diagram showing the distribution of voltages between the power plane 13 and the ground plane 12 measured along the direction of the length of the PCB 41b at the resonance frequency (at 474 MHz in the example) of the line composed of both the power plane 13 and the ground plane 12. The voltage is plotted on an ordinate in a logarithmic form. In either of the PCBs 41a, 41b, distribution of strong voltages appears at both ends of the PCB 41a, 41b and the distribution of weak voltages appears in a position slightly on a right side relative to a center of the PCB 41a, 41b. However, the voltage occurring between the power plane 13 and ground plane 12 becomes higher in the PCB 41b having the via-hole 42 at the place where the voltage is higher than in the PCB 41a having the via-hole at the place where the voltage is lower. Accordingly, this shows that much higher amounts of unwanted electromagnetic waves are emitted in the PCB 41b.

The above result shows that the voltage distribution map as shown in FIG. 10 can provide information being useful in deciding the position of the via-hole for interlayer wiring. By specifying a width of the voltage level in the map in stages in order of decreasing voltage strength and by classifying the region on the PCB, in accordance with voltage levels, into (a) the region 9a where mounting of the via-hole is prohibited, (b) the region 9b where mounting of the via-hole should be avoided, (c) the region 9c where mounting of the via-hole can be allowed when necessary, (d) the region 9d where the mounting of the via-hole is allowed with no problem or a like, layout of the interlayer via-hole can be effectively achieved, thus providing a useful support for design of the PCB.

Figure 14:
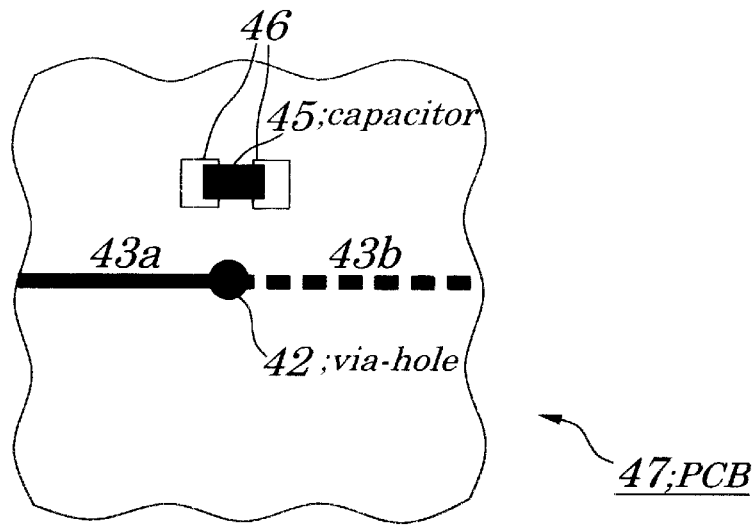
FIG. 14 is a diagram showing a part of layout of a four-layer PCB having a via-hole disposed between two planes according to the first-embodiment of the present invention.

FIG. 14 is a diagram showing a part of layout of a four-layer PCB 47 having the interlayer via-hole 42. An additional function is provided herein to give an instruction to mount a capacitor having an appropriate capacitance between the power plane 13 and the ground plane 12 in vicinity of the via-hole 42 when the interlayer via-hole 42 to connect a wiring 43a on a first layer to a wiring 43b on a fourth layer has to be mounted because of constraints of circuit layout at a region where the voltage is at a higher level (for example, the region 9a shown in FIG. 10). This additional function serves to provide support for design of the PCB in which the emission of unwanted electromagnetic waves caused by the via-hole 42 is reduced. Effects of reduction of the unwanted electromagnetic waves can be increased by making capacitance of an introduced capacitor 45 equal to a capacitance by which a serial resonance frequency is obtained in a serial resonance occurring in a combination of parasitic inductance possessed by the pad 32 used to mount the capacitor 45 and/or by the via-hole 42 used to connect the capacitor 45 to the power plane 13 and the ground plane 12.

Moreover, complex impedance between the power plane 13 and the ground plane 12 changes depending on a position where they are mounted on the PCB. An absolute value of the complex impedance is high at a region where the voltage is at a high level and the absolute value of complex impedance is low at a region where voltage is low. Therefore, instead of the voltage distribution described above, a complex impedance distribution map showing the absolute value may be used.

Figure 15:
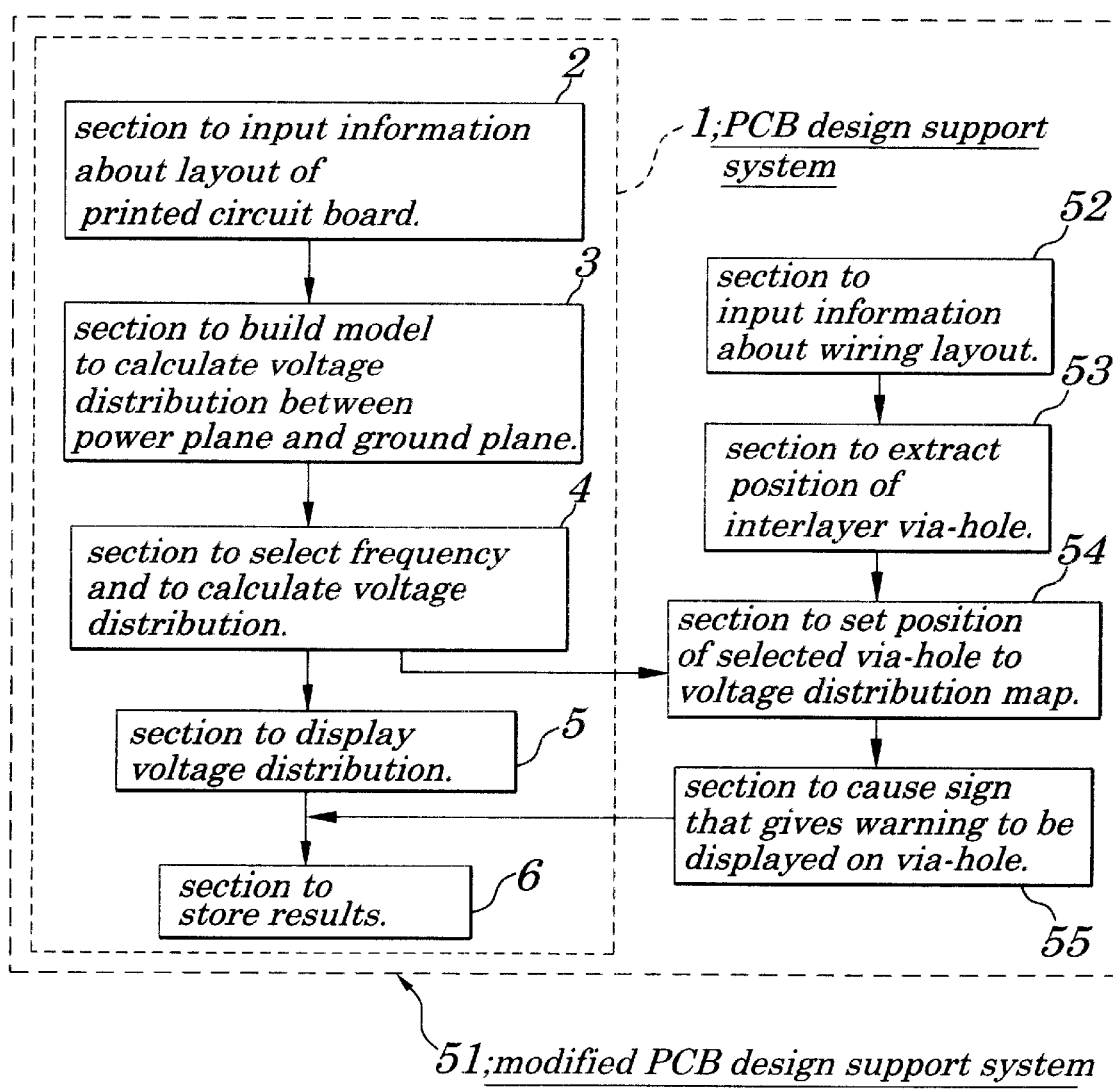
FIG. 15 is a schematic block diagram showing a modified PCB design support system to which technology of the first embodiment can be applied.

The technology of the first embodiment can be applied to a modified type of PCB design support system. FIG. 15 is a schematic block diagram showing a modified PCB design support system 51. As shown in FIG. 15, the modified PCB design support system 51 is composed of new sections added to the PCB design support system 1 described above including a new section 52 to input information about wiring layout of clock signal lines, data signal lines or a like, a section 53 to extract a position of an interlayer via-hole formed in a manner so as to straddle both the power plane and the ground planes based on the information about the wiring layout input by the above section 1, a section 54 having to set the extracted position of the via-hole to the map of voltage distribution occurring between the power plane and the ground plane and to display the position of the via-hole on the voltage distribution map, a section 55 to cause a sign that gives warning to be issued on any via-hole positioned in a place where a voltage is high.

Figure 16:
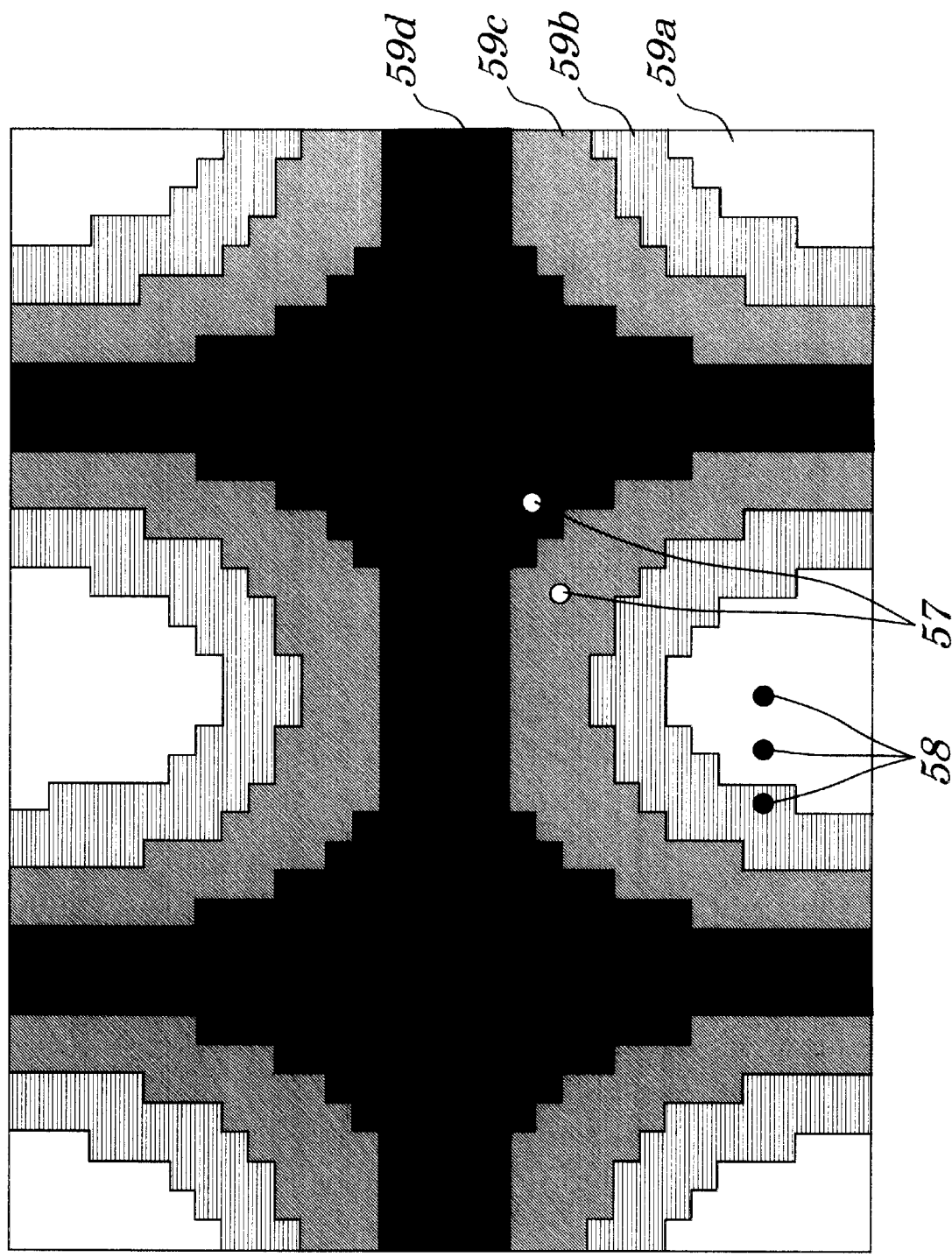
FIG. 16 is a diagram showing via-holes disposed between two planes which are plotted on the voltage distribution map according to the first embodiment of the present invention.

FIG. 16 is a diagram showing interlayer via-holes, positions of which are extracted by using the section to extract the position of the interlayer via-holes based on input information about the signal wiring layout, plotted on the voltage distribution map by using the section to calculate the voltage distribution described above. Thus, by issuing signs that give warning only to via-holes 57 positioned in the region 59a and region 59b where the voltage between the power plane and ground plane is higher, without issuing the sign to via-holes positioned in the region 59c and region 59d where the voltage between the power plane and the ground plane is lower, the interlayer via-holes that would cause the unwanted electromagnetic waves can be caught in a precautionary manner from a stage of the design of PCBs.

Figure 17:
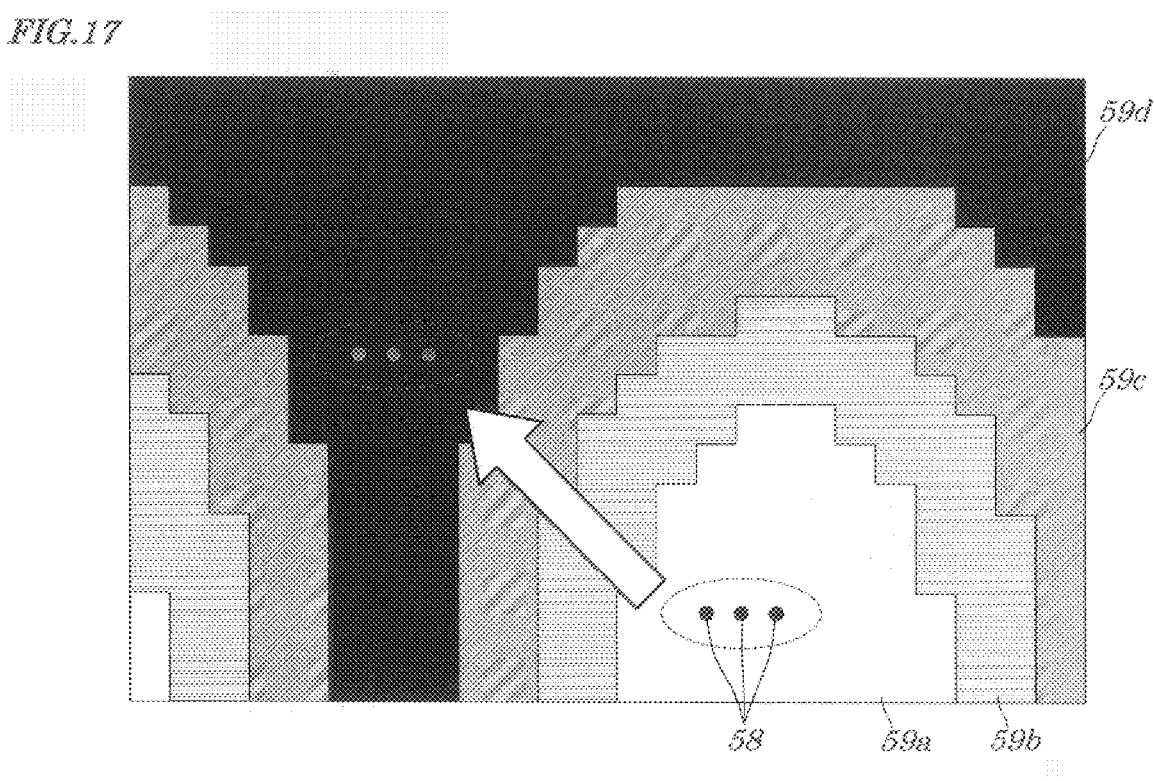
FIG. 17 is a diagram showing movement of an interlayer via-hole on the voltage distribution map according to the first embodiment of the present invention.

Moreover, as shown in FIG. 17, by further adding a function to find out a region where a voltage is lower in order to move the via-holes 58 to which the sign to gives warning has been issued by the section 55 contained in the PCB design support system 51 to a lower-voltage region or a function to instruct the PCB design support system 51 to automatically change the position of the via-holes to the lower-voltage place found by the above function, a burden on a designer can be decreased. Moreover, the function to input the information about the layout of signal wiring added in the PCB design support system 51 shown in FIG. 15 may be incorporated into the section 2 having to input the information about layout of the PCB embedded in the PCB design support system 1 shown in FIG. 1.

Second Embodiment

Figure 18:
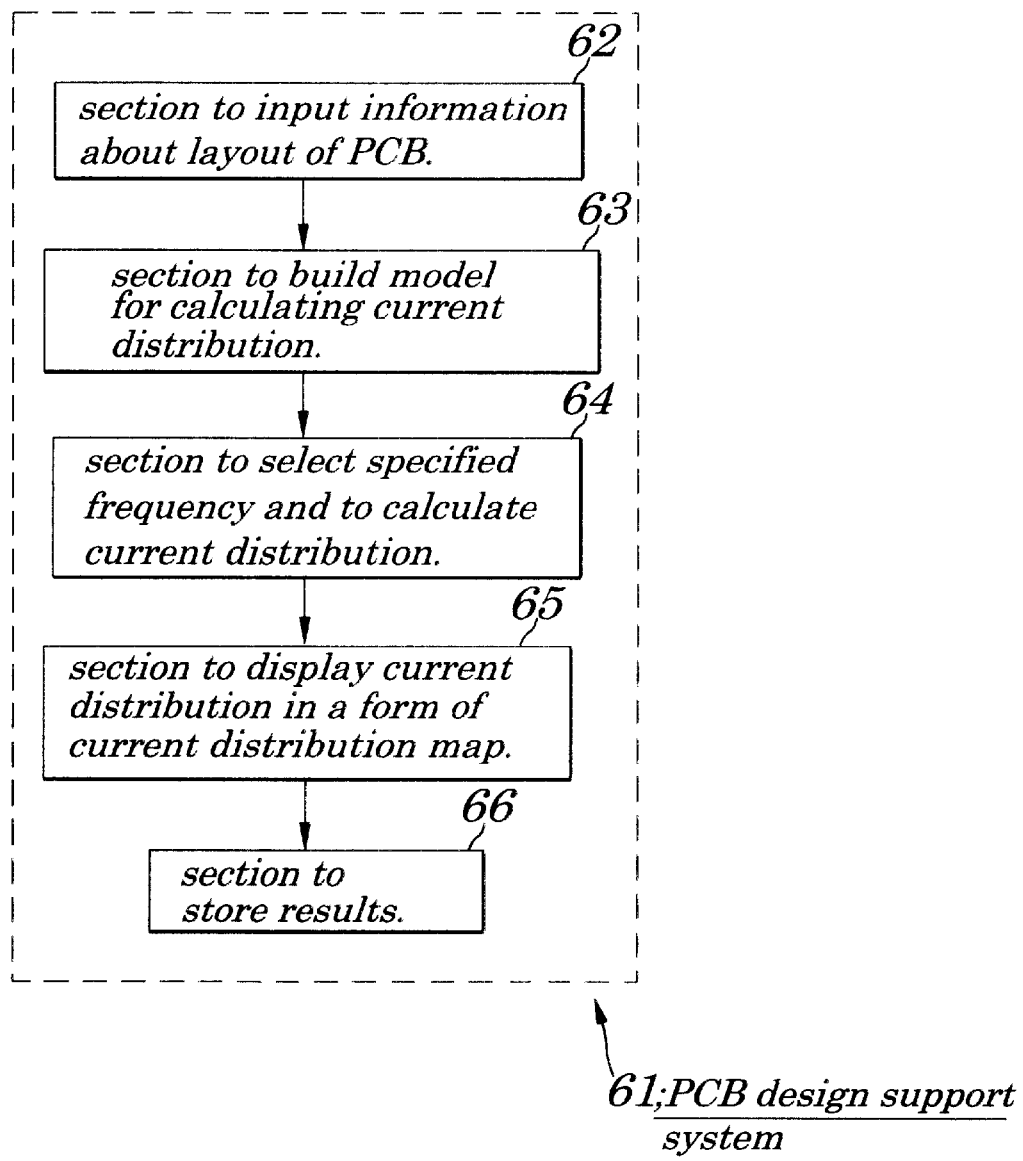
FIG. 18 is a schematic block diagram showing a PCB design support system according to a second embodiment of the present invention.

FIG. 18 is a schematic block diagram showing a PCB design support system 61 according to a second embodiment of the present invention. The PCB design support system 61 is composed of a section 62 to input information about layout of a PCB including information about positions of mounting active elements such as a ground plane, power plane, LSI, IC or a like and a decoupling capacitor, a section 63 to build a model for calculating distribution of current flowing on both the ground plane and the power plane, a section 64 to select a specified frequency and to calculate currents flowing at the selected frequency on both the ground plane and the power plane, in a manner parallel to each of the ground plane and the power plane and in X and Y directions (see FIG. 2), a section 65 to display obtained current distribution in a form of a two-dimensional current distribution map in a manner to correspond to a shape of the PCB, and a section 66 to store results from an execution of above functions. As in a case of the first embodiment, by using information about positions of mounting active elements such as the ground plane, power plane, LSI, IC or a like and of the decoupling capacitor or the like, a calculation model expressed by an equivalent circuit in which the power plane and the ground plane are regarded as parallel-plate lines can be built. In the section 64, calculation of current distribution is performed at a frequency associated with the PCB, for example, at a clock frequency and at the frequency being an integral multiple of the clock frequency.

Figure 19:
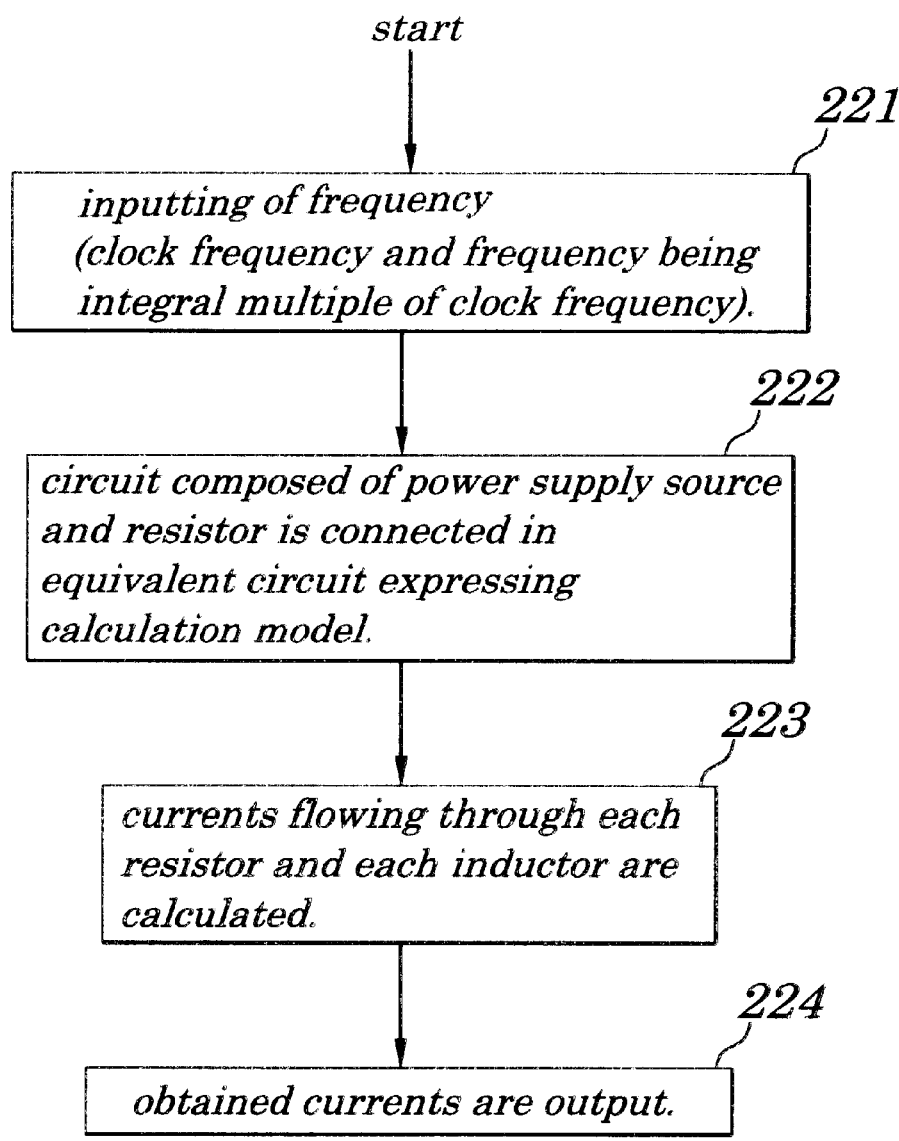
FIG. 19 is a flowchart explaining procedures for calculating current distribution by a section to select specified frequency and to calculate current distribution in the PCB design support system according to the second embodiment of the present invention.

Procedures for calculating the current distribution using the calculation model expressed by the equivalent circuit shown in FIG. 3 will be described by referring to FIG. 19. First, a frequency to be analyzed is selected and input (Step 221). Generally, in the PCB, unwanted electromagnetic waves are strongly radiated at the clock frequency and at the frequency being the integral multiple of the clock frequency and therefore these frequencies are input as an example. The above frequencies can be directly input based on information about the PCB specification. The current flowing through each resistor or each inductor can be calculated by connecting a serial circuit composed of a power supply source 215 and a resistor 216 to the equivalent circuit expressing the calculation model as shown in FIG. 9 and by driving the equivalent circuit (Steps 222 and 223). The current distribution is always at a maximum at four corners of a substrate, that is, at opening ends of the substrate. Driving of the equivalent circuit is preferably performed at nodes corresponding to places at the four corners of the substrate. The power supply source having an infinite internal resistance may be connected hereto.

Figure 20A:
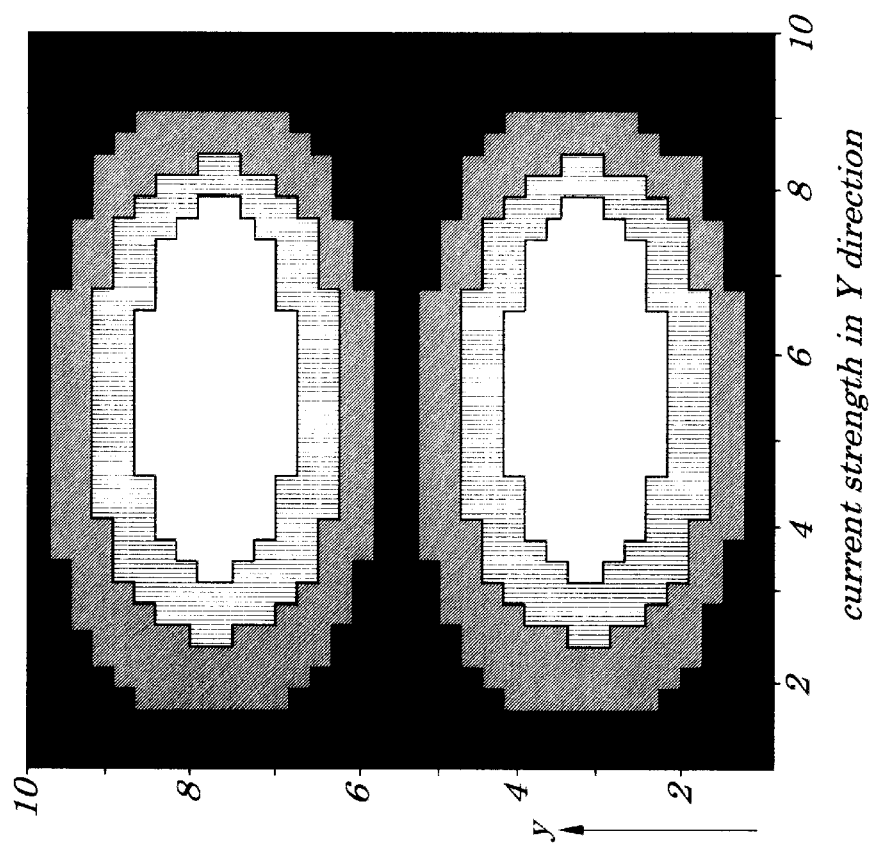
FIGS. 20A and 20B show maps of a strength of a current flowing on both the ground plane and the power plane according to the second embodiment of the present invention.
Figure 20B:
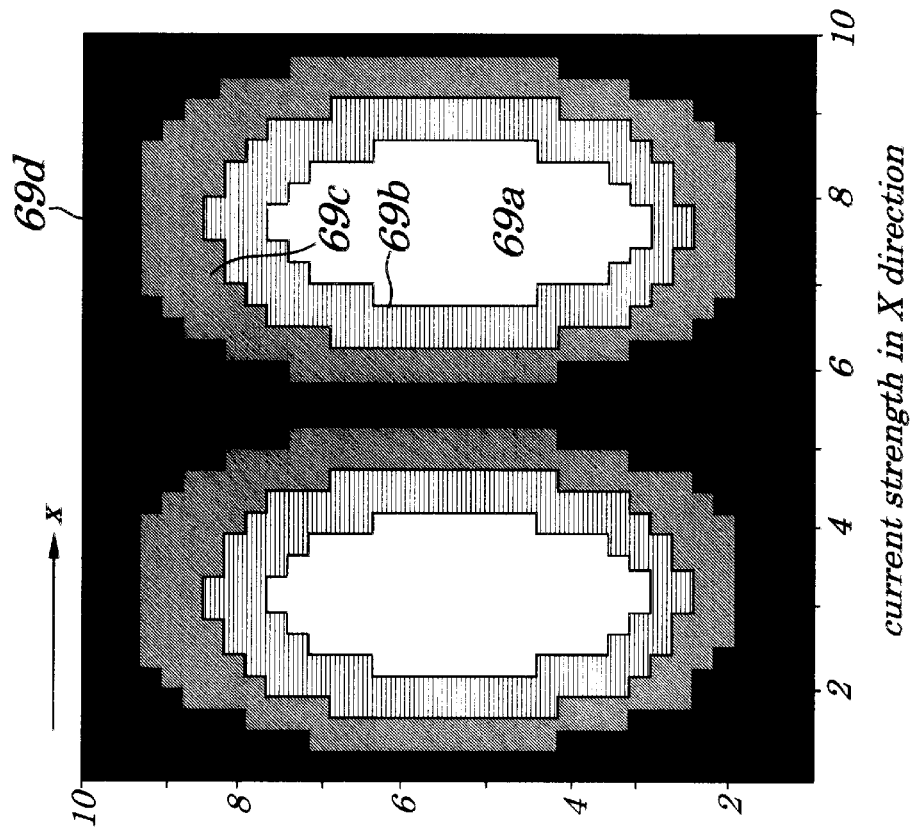

Finally, obtained currents flowing through each device are output (Step 224). A circuit simulator such as SPICE can be used for calculation using the calculation model expressed by the equivalent circuit. By using the section 64 to display current distribution contained in the PCB design support system 61, the distribution of currents flowing on both the ground plane and the power plane is displayed in stages and in order of decreasing current strength in a form of current distribution map. The distribution of currents flowing in an X direction and that of currents flowing in a Y direction are separately displayed as shown in FIGS. 20A and 20B.

Figure 21:
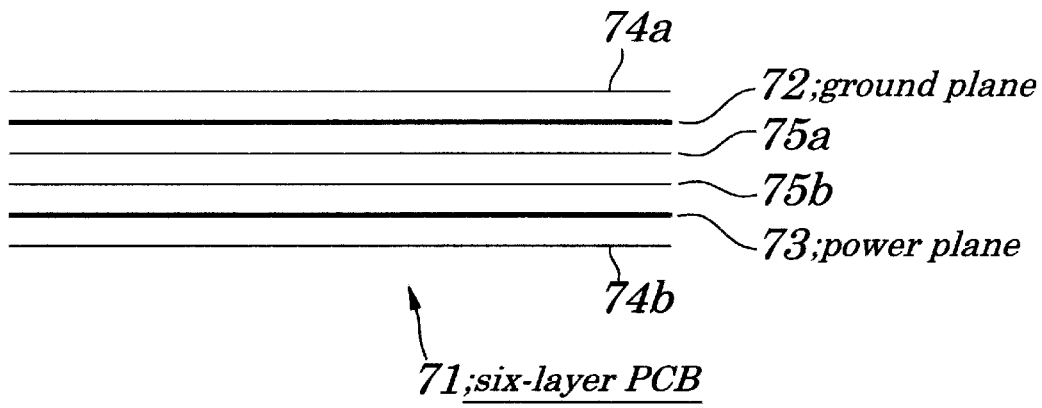
FIG. 21 is a cross-sectional view of the six-layer PCB used to explain effects achieved by the PCB design support system according to the second embodiment of the present invention.

Reasons why the PCB design support system 61 of the present invention is effective in designing the PCB in which the emission of unwanted electromagnetic waves can be reduced are explained below. As described above, in a multilayer PCB, both a ground plane and a power plane are mounted as internal layers. In a PCB having grater numbers of layers, a layer put between the ground plane and the power plane is used for wiring of signal lines. For example, in a six-layer PCB as shown in FIG. 21, a second layer is used as a ground plane 72, a fifth layer is used as a power plane 73, and not only on a first layer 74a and sixth layer 74b but also on a third layer 75a and fourth layer 75b disposed between the ground plane and the power plane are mounted clock signal lines and/or data signal lines. When variations in voltages between the ground plane and the power plane occur, a current flows causing standing waves to be generated.

Figure 22:
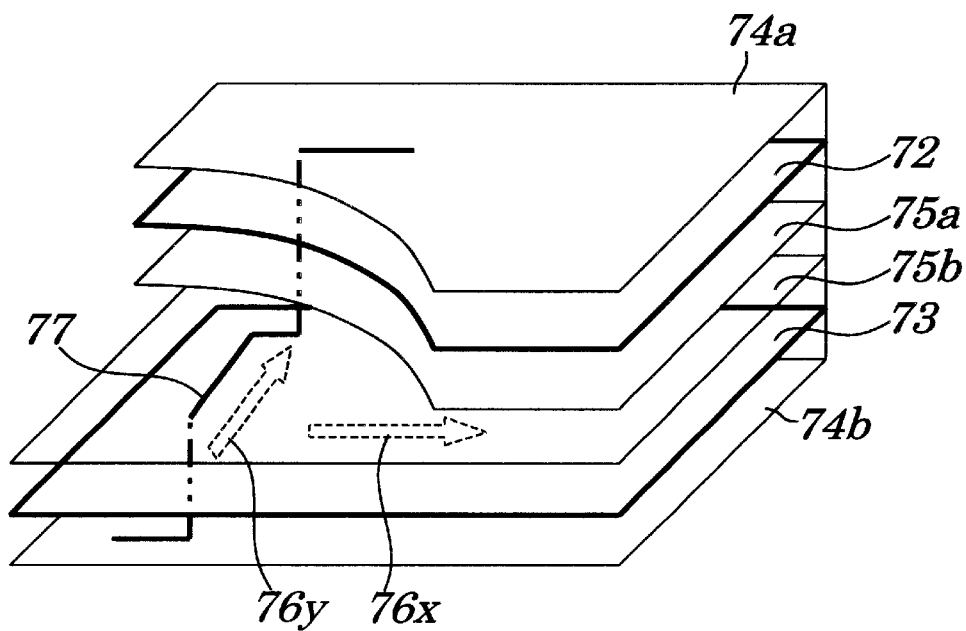
FIG. 22 is a perspective view of a six-layer PCB with a part cut away to explain effects achieved by the PCB design support system according to the second embodiment of the present invention.

FIG. 22 is a perspective view of the six-layer PCB with a cut-away view. The currents flowing on both the power plane and the ground plane is composed of a current component 76x flowing in an X direction and a current component 76y flowing in a Y direction. If a wiring 77 disposed along a y-axis exists in an internal layer 75a, 75b in a region where the current component 76y flowing in the Y direction is strong, a strong current flows on both the ground plane and the power plane due to induction by currents flowing through the wiring 77, causing a great variation in voltages, which causes a strong emission of the unwanted electromagnetic waves. A same phenomenon occurs in current components flowing in the X direction.

The current distribution map obtained by the calculation described above can provide information being effective in deciding wiring layout between the power plane and the ground plane. By specifying a width of the current level in the current distribution map, as shown in FIGS. 20A and 20B, in stages and in order of decreasing current strength and by classifying the region on the current distribution map, in accordance with current levels, into (a) a region 69a where the wiring is prohibited in the layer put between the power plane and the ground plane, (b) a region 69b where the wiring should be avoided, (c) a region 69c where the wiring can be allowed when necessary, (d) a region 69*d* where the wiring is allowed with no problem, an effective guidance for signal-wiring on the layer put between the power plane and the ground plane can be obtained.

Figure 23:
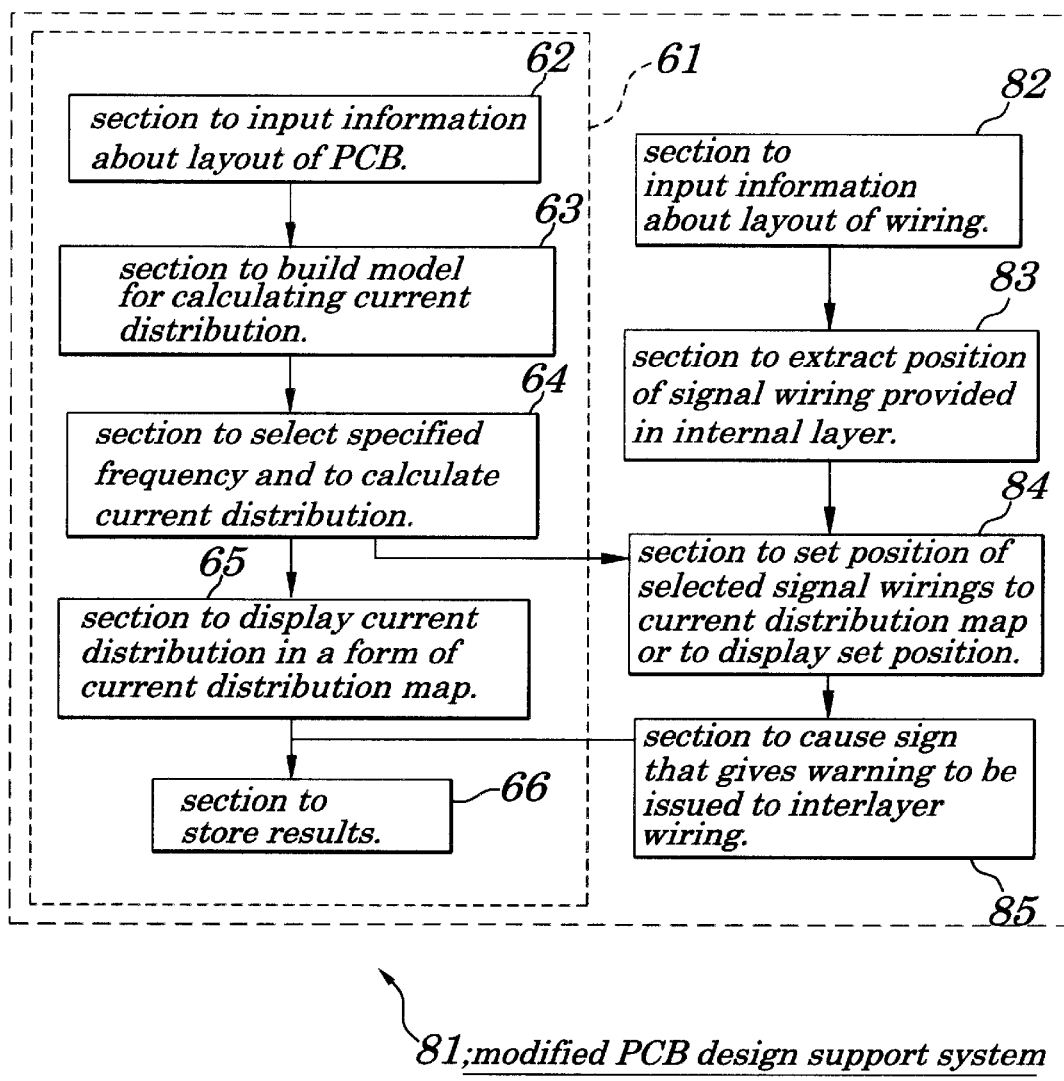
FIG. 23 is a schematic block diagram showing a modified PCB design support system to which technology of the second embodiment can be applied.

Technology of the second embodiment can be applied to a modified type of PCB design support system. FIG. 23 is a schematic block diagram showing a modified PCB design support system 81. As shown in FIG. 23, the modified PCB design support system 81 is composed of new sections added to PCB design support system 61 described above including a new section 82 to input information about layout of installing wiring for a clock signal, data signal or a like, a section 83 to extract a position of installing the wiring provided in an internal layer put between the power plane and the ground plane based on input information about signal lines, a section 84 to set the extracted position of the'signal lines mounted in the internal layer to a map of currents flowing on both the power plane and the ground plane in the X and Y directions or to display the position of the signal lines on the current distribution map, a section 85 to cause a sign that gives warning to be issued to the interlayer wiring positioned in a place where a current is at a high level on the map.

Figure 24A:
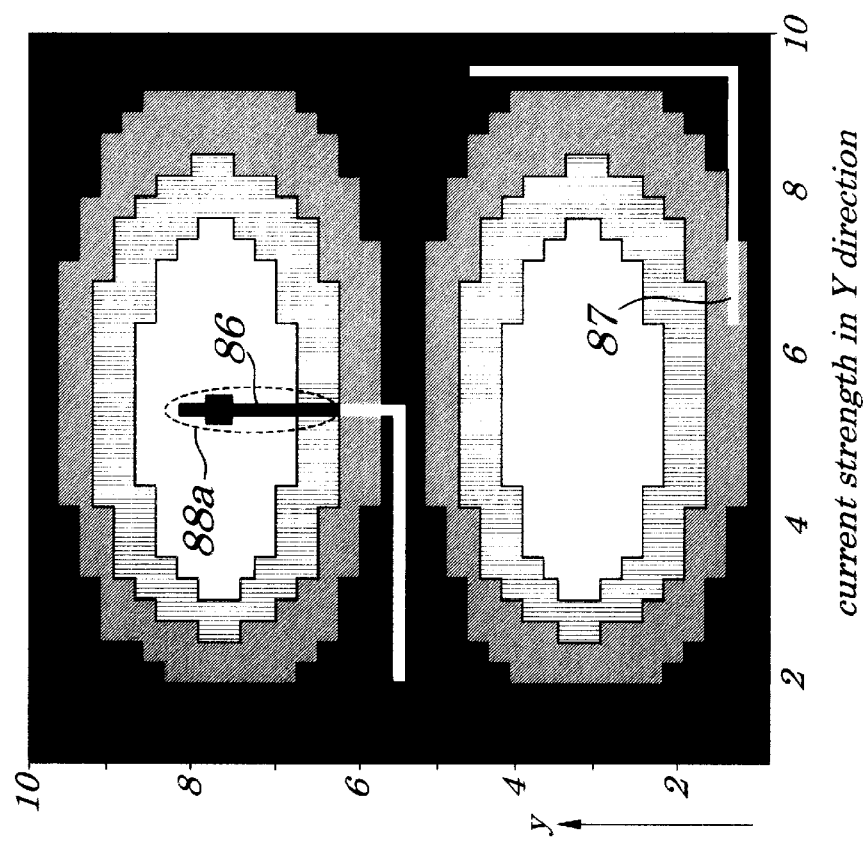
FIGS. 24A and 24B show respectively an interlayer wiring pattern on a current distribution map according to the second embodiment of the present invention.
Figure 24B:
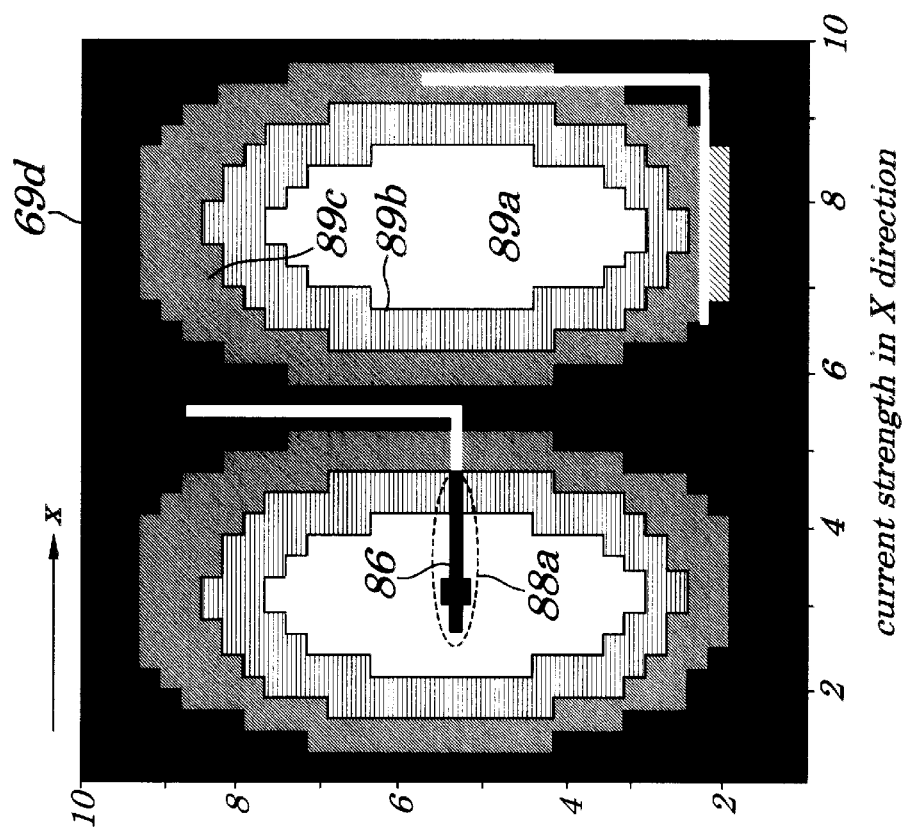

FIGS. 24A and 24B show respectively an interlayer wiring 86 plotted, by using the section 83 to extract the position of the interlayer wiring, on the current distribution map obtained in the. X direction as shown in FIG. 24A and on the current distribution map obtained in the Y direction as shown in FIG. 24B, displayed by using the section 65 to display the current distribution. Thus, by issuing signs that give warning only to interlayer wiring 88*a* positioned in regions 89*a* and 89*b* where amounts of the current are large, without issuing the sign to interlayer wiring 87 positioned in regions 89*c* and 89*d* where amounts of the current are comparatively small, the interlayer wiring that would cause the unwanted electromagnetic waves can be caught in a precautionary manner from a stage of the design of the PCB. Moreover, by adding a function to find out the region where the amounts of the current are small in order to move interlayer wiring 88*a* to which the sign to gives warning has been issued by the section 85 contained in the PCB design support system 81 to the region where the current is small or a function to instruct the PCB design support system 81 to automatically change position of the interlayer wiring to the region found by the above function, a burden on a designer can be decreased. Furthermore, the function to input the information about the signal wiring layout added in the PCB design support system 81 shown in FIG. 23 may be incorporated into the section 62 to input the information about layout of the PCB embedded in the PCB design support system 61 shown in FIG. 23.

Figure 25:
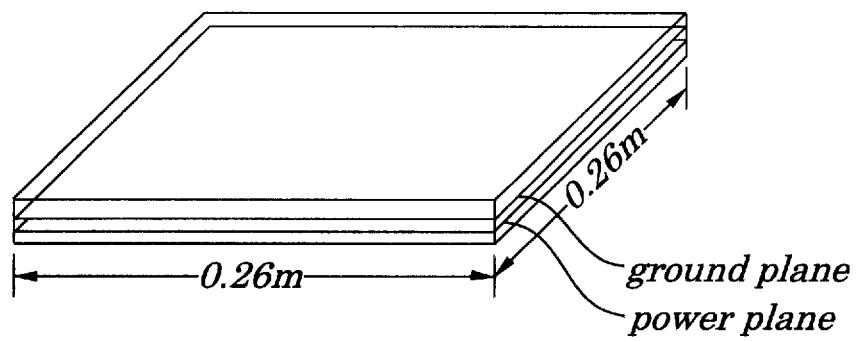
FIG. 25 is a diagram showing an example of a circuit composed of the power plane and ground plane implemented according to the second embodiment of the present invention.
Figure 26:
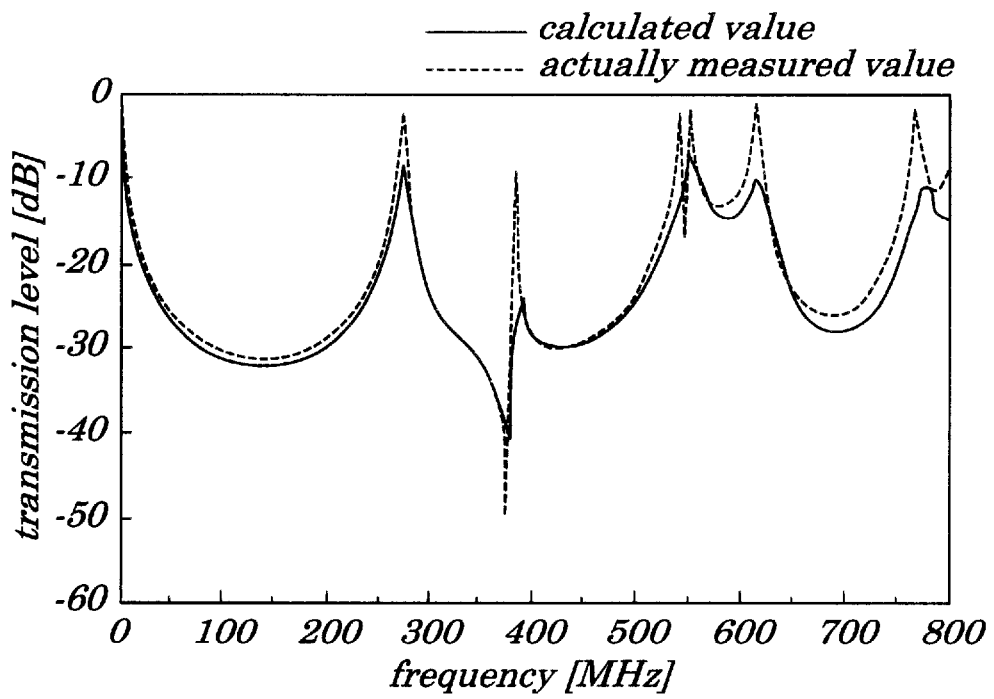
FIG. 26 is a graph showing equivalent characteristics of a four-layer PCB of FIG. 25.
Figure 27:
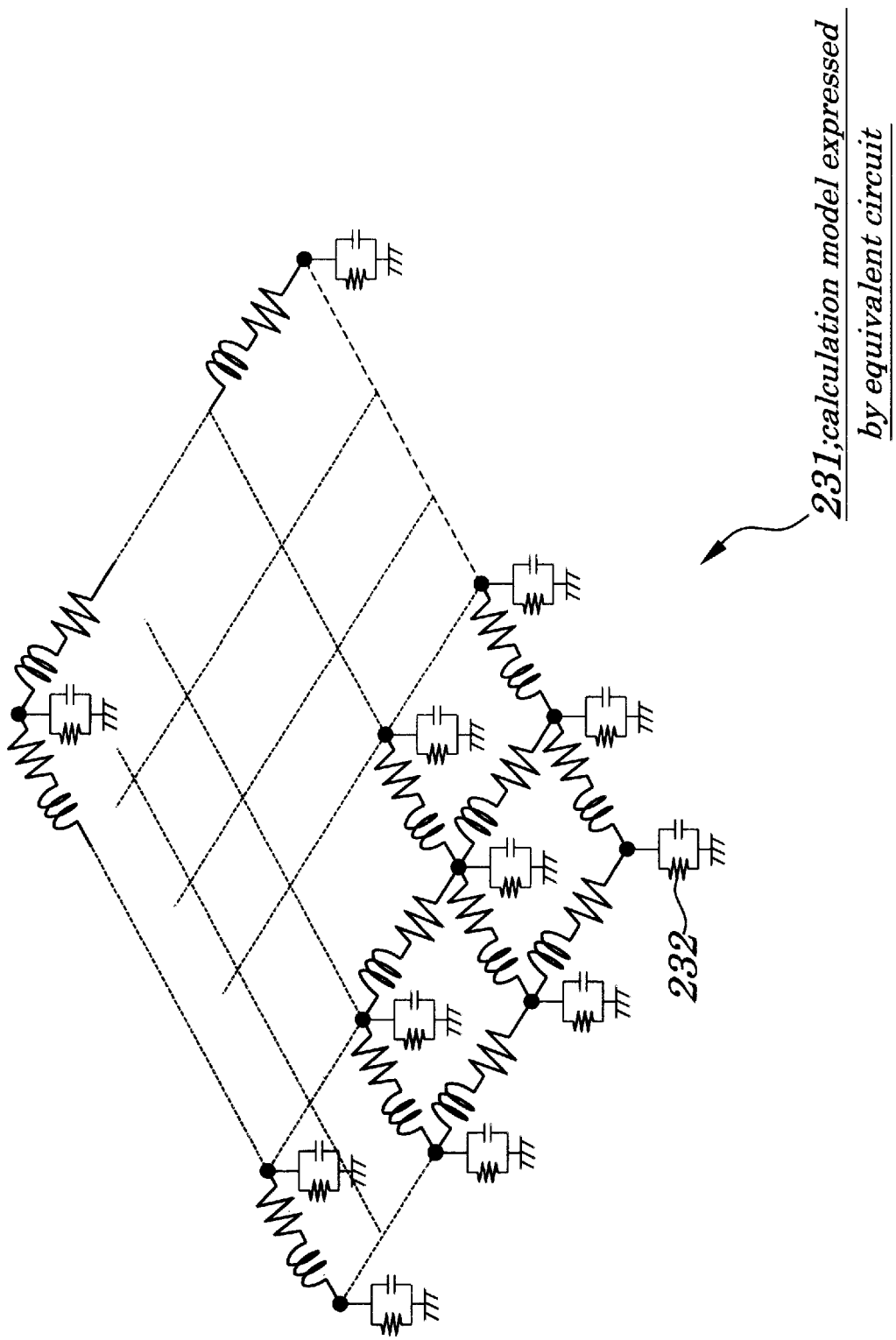
FIG. 27 is a calculation model expressed by an equivalent circuit model in which an influence by dielectric loss is considered according to the second embodiment of the present invention.

By using the calculation model expressed by the equivalent circuit, a transmission characteristic of a system composed of both the power plane and the ground plane on a four-layer PCB being 0.26 m long and 0.26 m wide as shown in FIG. 25 was calculated. Results from the calculation together with actually measured values are shown in FIG. 26, in which a solid line represents actually measured values and a broken line represents calculated values. A difference of 5 dB to 10 dB was found in transmission levels at frequencies forming peaks. The inventors have found by investigating these results in detail that a reason for a difference in transmission level is due to a fact that only conductive loss in the power plane and the ground plane had been considered in the model used for the calculation and that an influence by dielectric loss caused by dielectric materials that make up a substrate had been disregarded.

Therefore, a calculation model 231 expressed by an equivalent circuit in which influence by the dielectric loss is considered was built for calculation. To incorporate an effect of dielectric loss, a resistor 232 is connected to the equivalent circuit. A resistance of the resistor 232 was calculated by using the following equation:

$$Rd = d/(2\pi f \in_o \in_r l^2 \tan \delta)$$

where "tan δ" represents a dielectric loss tangent expressing loss of a dielectric, "l" is a length of a side of a cell, "d" represents a distance between a power plane and a ground plane, "$\in_o$" represents a dielectric constant in a vacuum, "$\in_r$" represents a specific inductive capacity of a dielectric material, "π" represents a ratio of the circumference of a circle to its diameter and "f" represents a frequency.

Figure 28:
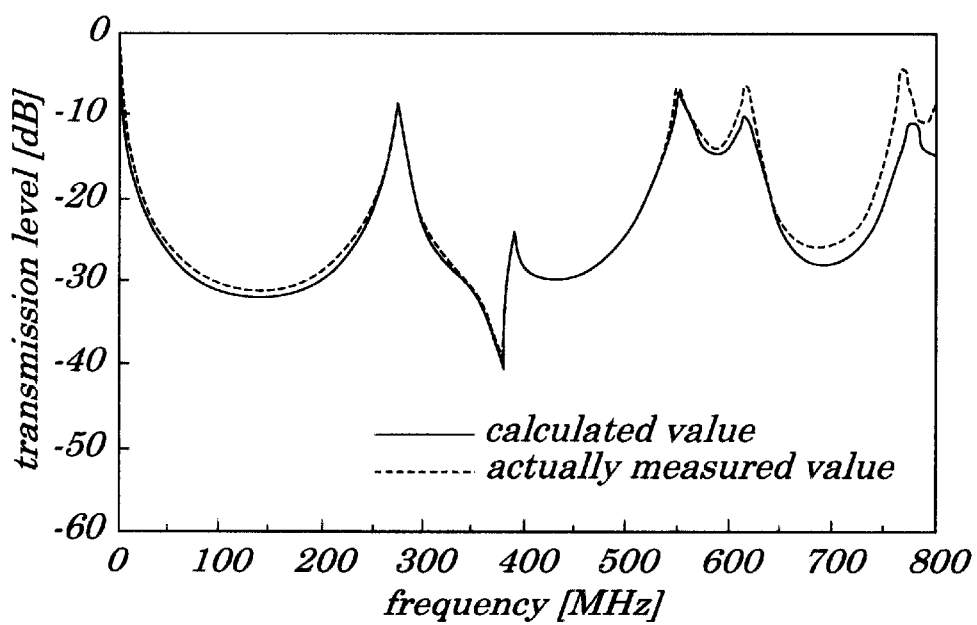
FIG. 28 is a graph showing equivalent circuit characteristics obtained by using the equivalent circuit model of FIG. 27.

As is apparent from the above equation, the dielectric loss changes depending on a frequency. Results from the calculation together with actually measured values are shown in FIG. 28. To simplify the calculation, a value obtained at a frequency of 300 MHz as a dielectric loss is used at all frequency bands. Transmission levels match well the actually measured value, showing that the calculation model 231 is excellent in expressing actual characteristics. A difference occurred at high frequencies is due to a fact that a frequency characteristic is not considered to calculate dielectric loss. More exact calculation is possible by introducing the frequency characteristics.

Figure 29:
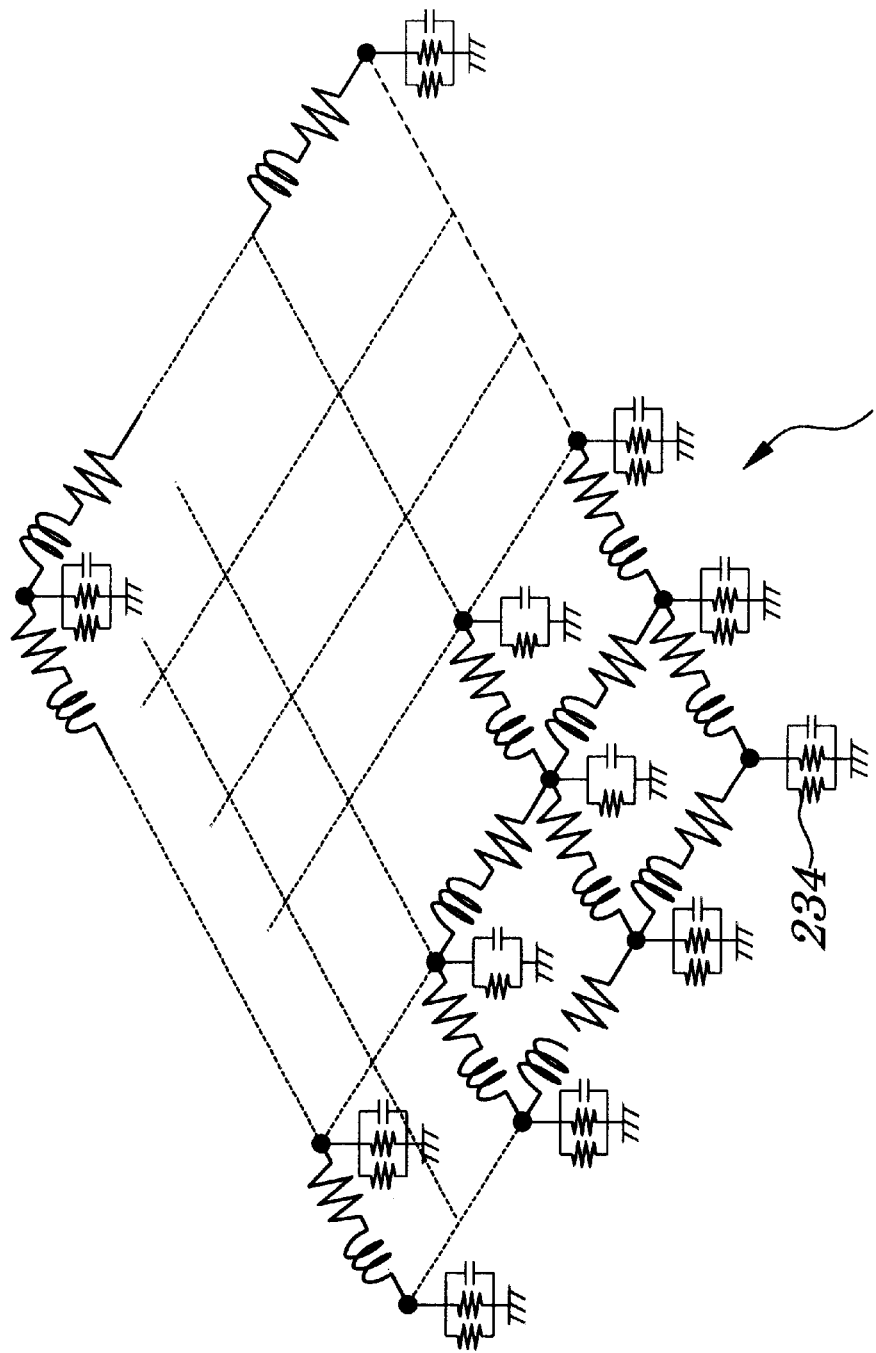
FIG. 29 is a calculation model expressed by an equivalent circuit in which loss caused by radiation resistance is considered according to the second embodiment of the present invention.
Figure 30A:
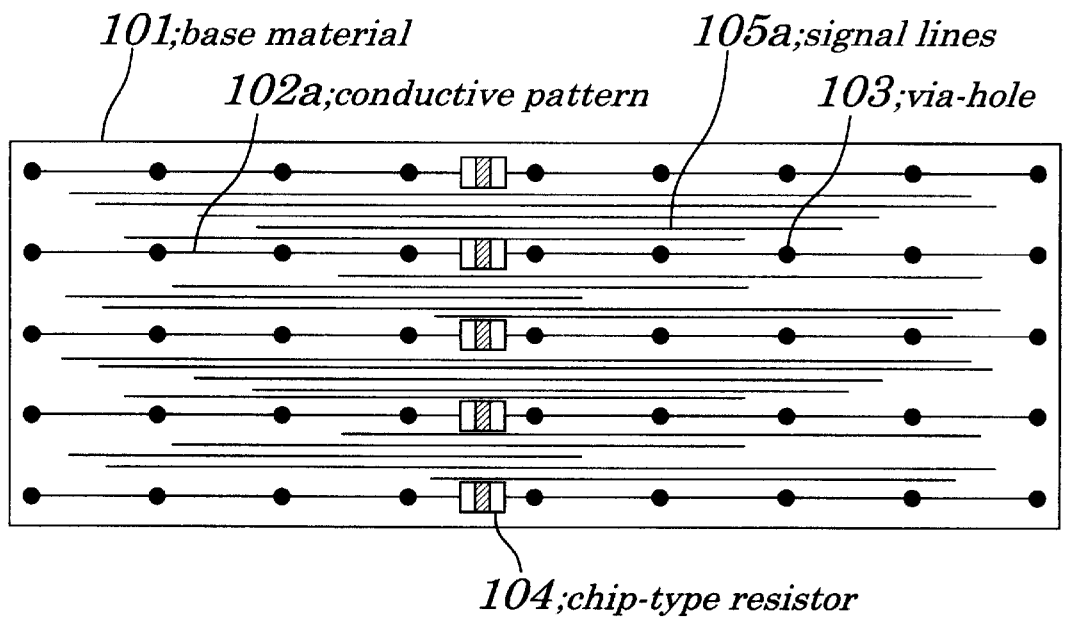
FIGS. 30A and 30B are diagrams showing a conventional PCB and a conventional method for designing a same.
Figure 30B:
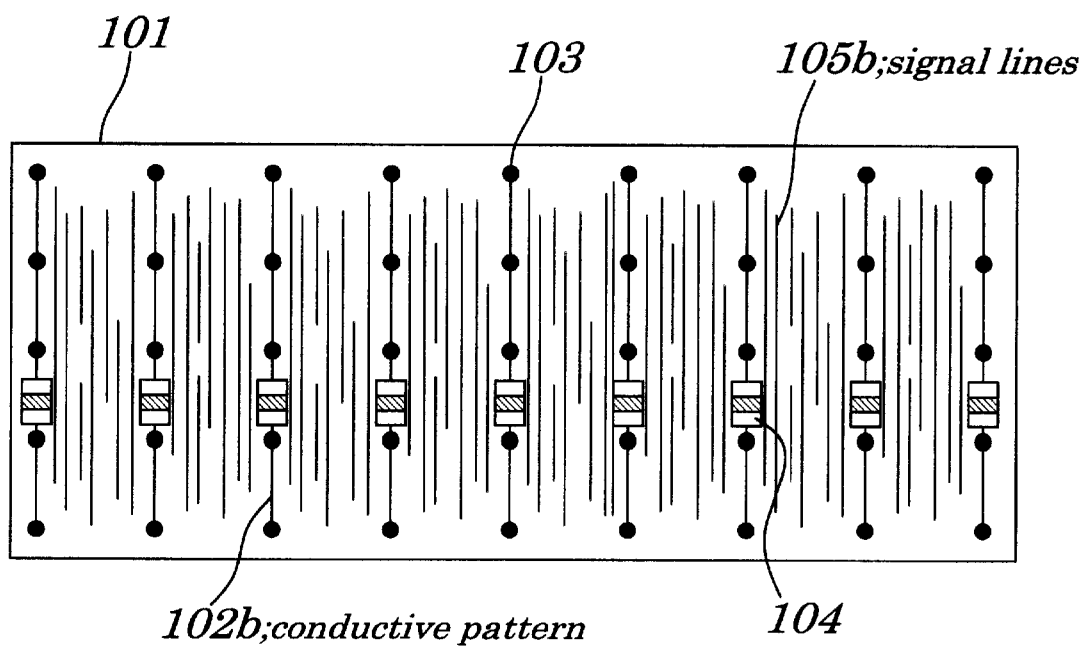
Figure 31:
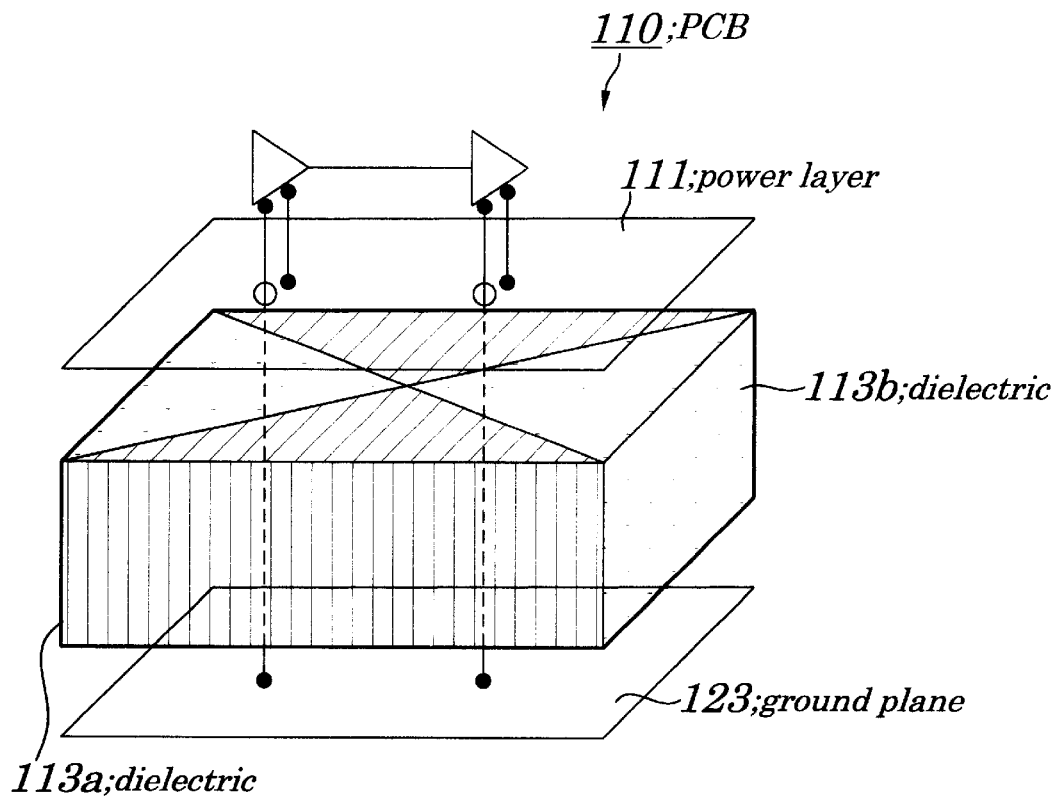
FIG. 31 is a diagram showing a PCB and electronic devices designed in accordance with conventional technology.
Figure 32:
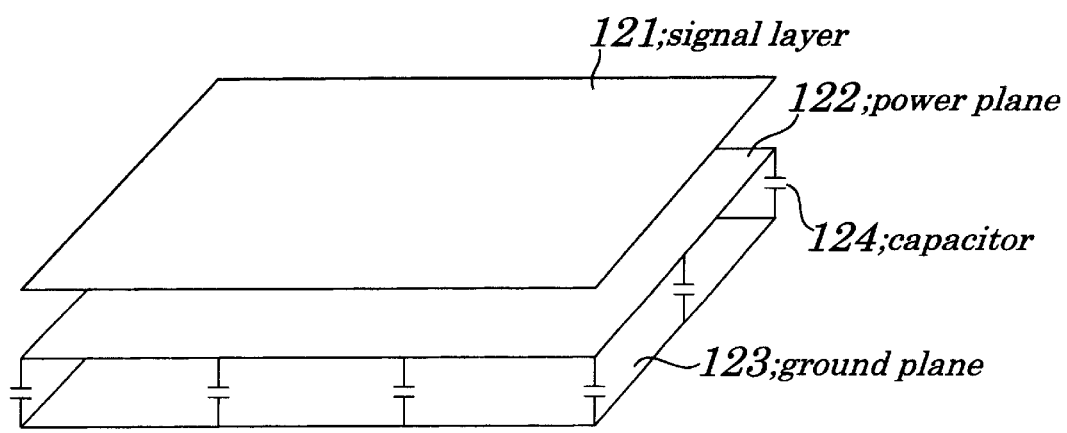
FIG. 32 is a diagram of a multilayer PCB designed in accordance with conventional technology.
Figure 33:
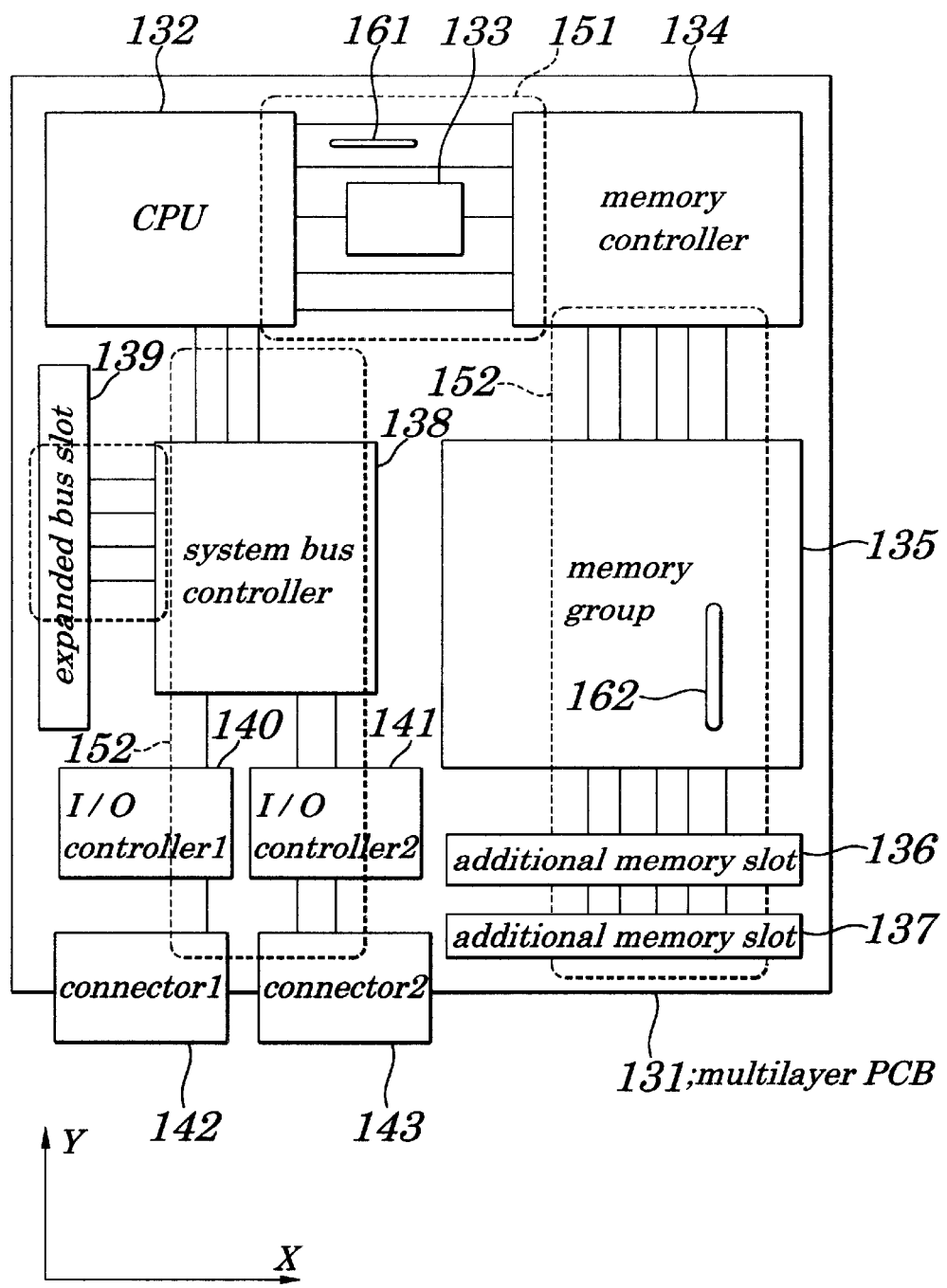
FIG. 33 is a diagram showing a method for designing a PCB in accordance with conventional technology.

In a calculation model 233 expressed by equivalent circuit shown in FIG. 29, an influence by radiation of the unwanted electromagnetic waves is expressed by a radiation resistor 234. Since the radiation of unwanted electromagnetic waves from the power plane and the ground plane occurs mainly at their ends, the radiation resistor 234 is connected to ends of the power plane and the ground plane. A value of radiation resistance is decided by referring to a value of a radiation resistor for a short microstop antenna because it has a very similar structure to the radiation resistor to be connected. (see Haishi et al., "Small-size Plane Antenna". Transaction of the Institute of Electronics, Information and Communication Engineers, 1996, pp. 128). Since influence from radiation resistance is large, in particular, at high frequencies, by adding this term to the calculation model 233, more accurate calculation is made possible.

As described above, according to the present invention, a measure to reduce emission of unwanted electromagnetic waves from a PCB can be incorporated from a stage of designing the PCB and radiation of electromagnetic waves can be reduced by optimizing layout of the PCB while following a conventional method for its designing and by maintaining a conventional structure of the PCB.

It is apparent that the present invention is not limited to the above embodiments but may be changed and modified without departing from the scope and spirit of the invention.

What is claimed is:

1. A printed circuit board (PCB) design support system comprising:

an inputting means to input an information about ground plane structure, power plane structure and layout of a PCB including information about positions of mounting active elements and at least one decoupling capacitor;

a model building means to build a circuit model expressed by an equivalent circuit for calculating, using said input information, voltage distribution between said ground plane and said power plane;

a calculating means to select a specified frequency and to calculate voltage distribution occurring at said specified frequency between said ground plane and said power plane;

a displaying means to display said obtained voltage distribution in a form of a two-dimensional voltage distribution map in a manner to correspond to a shape of said PCB; and a storing means to store the result obtained from operations,
wherein the model building means expresses the equivalent circuit as a planar matrix of nodes, each of the adjacent nodes being connected by an inductor and a resistor, and each of the nodes being further connected to a grounded capacitor.

2. The PCB design support system according to claim 1, wherein,
the input information used by the model building means is free of a signal line information, and
said display means puts said voltage distribution map on said PCB in a manner that they overlap each other and displays regions expressing voltage levels on said voltage distribution map in order of decreasing height of voltage and in stages.

3. The PCB design support system according to claim 1, further comprising a classifying means to designate said voltage distribution map as a map having several stages of voltage levels defined in order of decreasing height of voltage and to classify specified voltage levels on said map into voltage level regions including one region where disposing of a via-hole straddling said ground plane and said power plane is prohibited and one region where disposing of said via-hole is allowed.

4. The PCB design support system according to claim 1, wherein said calculating means calculates, instead of said voltage distribution, complex impedance between said ground plane and said power plane and displays absolute values of a result of said calculation.

5. A printed circuit board (PCB) design support system comprising:
an inputting means to input an information about ground plane structure, power plane structure and layout of a PCB including information about positions of mounting active elements and at least one decoupling capacitor;
a model building means to build a circuit model expressed by an equivalent circuit for calculating, using input said information, voltage distribution between said ground plane and said power plane;
a calculating means to select a specified frequency and to calculate voltage distribution occurring at said specified frequency between said ground plane and said power plane;
a displaying means to display said obtained voltage distribution in a form of a two-dimensional voltage distribution map in a manner to correspond to a shape of said PCB;
a storing means to store the result obtained from operations;
an extracting means to extract a position of said via-hole straddling said ground plane and said power plane based on input said information about signal wiring including layout information, a setting means to set said extracted position of said via-hole to said voltage distribution map of said calculated voltage distribution occurring between said ground plane and said power plane and/or to display said extracted position of said via-hole on said voltage distribution map and a warning means to issue a sign that gives warning to any of said via-hole disposed in a region here a voltage is at a high level.

6. The PCB design support system according to claim 5, further comprising an instructing means to provide an instruction that a capacitor to connect said ground plane to said power plane is mounted near said via-hole formed so as to straddle said ground plane and said power plane and mounted in a region where a voltage is high.

7. The PCB design support system according to claim 6, further comprising a finding means to find out and specify a region having a lower voltage to which any said via-hole given said sign that gives warning is able to be moved and/or to instruct a PCB layout design apparatus to automatically move said via-hole given said sign that gives warning to said low-voltage region.

8. A PCB support system comprising:
an inputting means to input information about ground plane structure, power plane structure and layout of a PCB including information about positions of mounting active elements and at least one decoupling capacitor;
a model building means to build a circuit model for calculating, using input said information, distribution of currents flowing on both said ground plane and said power plane;
a calculating means to select a specified frequency and to calculate distribution of currents flowing, at said specified frequency, in two directions in a manner being parallel to ends of said ground plane and said power plane, on both said ground plane and said power plane;
a displaying means to display separately each of said current distributions obtained in said two current flowing directions in a form of a two-dimensional current distribution map in a manner to correspond to a shape of said PCB; and
a storing means to store results obtained from operations,
wherein the model building means expresses the circuit model as a planar matrix of nodes, each of the adjacent nodes being connected by an inductor and a resistor, and each of the nodes being further connected to a grounded capacitor.

9. The PCB design support system according to claim 8, wherein,
the circuit model further includes at least one resistor in parallel with the grounded capacitor, and
said displaying means puts said current distribution map on said PCB in a manner that they overlap each other and displays regions expressing current levels on said current distribution map in order of decreasing strength of current and in stages, separately for each of current distributions obtained in said two current flowing directions.

10. The PCB design support system according to claim 8, further comprising a classifying means to designate each of said current distribution maps obtained in said two current flowing directions as maps having several stages of current levels defined in order of decreasing strength of current and to classify specified current levels on said maps into current level regions including one region where installation of wiring in a same direction as for current flowing direction in a layer disposed between said ground plane and said power plane is prohibited and one another region where said installation of wiring is allowed.

11. The PCB design support system according to claim 8, further comprising an exacting means to extract a position of said wiring installed in said layer disposed between said ground plane and said power plane based on input said information about a signal wiring including layout information, a setting means to set said extracted position of said wiring installed in said layer to each of said current distribution maps of said calculated current distributions obtained in said two current flowing directions between said ground plane and said power plane and/or to display said extracted position of said wiring on said current distribution map and a warning means to issue a sign that gives warning to any wiring installed in a same direction as for current flowing direction in a layer and disposed in a region where a current is at a high level.

12. The PCB design support system according to claim 11, further comprising a finding means to find out and specify a region where said current flowing on both said ground plane and said power plane is at a low level, to which said wiring given said sign that gives warning is able to be moved and/or to instruct a PCB layout design apparatus to automatically move said wiring given said sign that gives warning to said low-current region.

13. A method of designing a PCB comprising steps of:
   inputting information about ground plane structure, power plane structure and layout of a PCB including information about positions of mounting active elements and at least one decoupling capacitor;
   building a circuit model for calculating, using input said information, currents flowing on both said ground plane and said power plane,
      the circuit model being a planar matrix of nodes, each of the adjacent nodes being connected by an inductor and a resistor, and each of the nodes being further connected to a grounded capacitor;
   selecting a specified frequency and calculating distribution of current flowing in two directions in a manner being parallel to ends of said ground plane and said power plane, at said specified frequency, on both said ground plane and said power plane;
   displaying separately each of said current distributions obtained in said two current flowing directions in a form of a two-dimensional current distribution map in a manner to correspond to a shape of said PCB; and
   deciding, using said current distribution map, a position of installing wiring in a layer disposed between said ground plane and said power plane.

14. A machine-readable storage medium storing a control program used for designing a PCB, wherein said control program causes a computer to carry out steps of:
   inputting information about ground plane structure, power plane structure and layout of a PCB including information about positions of mounting active elements and at least one decoupling capacitor;
   building a circuit model for calculating, using input said information, voltage distribution between said ground plane and said power plane, the circuit model being a planar matrix of nodes, each of the adjacent nodes being connected by an inductor and a resistor, and each of the nodes being further connected to a grounded capacitor;
   selecting a specified frequency and of calculating voltage distribution occurring at said specified frequency between said ground plane and said power plane,
      the calculating of voltage distribution including adding a corner resistor at a corner of the matrix, then driving the matrix with a voltage source at the selected frequency, and calculating the voltage at each node of the matrix;
   displaying said obtained voltage distribution in a form of a two-dimensional voltage distribution map in a manner to correspond to a shape of said PCB; and
   deciding, using said voltage distribution map, a position of disposing a via-hole formed in a manner to straddle said ground plane and said power plane.

15. A machine-readable storage medium storing a control program used for designing a PCB, wherein said control program causes a computer to carry out steps of:
   inputting information about ground plane structure, power plane structure and layout of a PCB including information about positions of mounting active elements and at least one decoupling capacitor;
   building a circuit model for calculating, using input said information, distribution of currents flowing on both said ground plane and said power plane, the circuit model being a planar matrix of nodes, each of the adjacent nodes being connected by an inductor and a resistor, and each of the nodes being further connected to a grounded capacitor;
   selecting a specified frequency and calculating distribution of currents flowing, at said specified frequency, in two directions in a manner being parallel to ends of said ground plane and said power plane, on both said ground plane and said power plane;
   displaying separately said obtained two current distributions obtained in said two current flowing directions in a form of a two-dimensional current distribution map in a manner to correspond to a shape of said PCB; and
   deciding, by using said current distribution map, a position of installing wiring in a layer disposed between said ground plane and said power plane.

16. An equivalent circuit model, expressed by an equivalent circuit, for supporting design of a PCB to calculate the distribution of voltages between a ground plane and a power plane, distribution of currents flowing on said ground plane and said power plane, and complex impedance between said ground plane and said power plane, comprising:
   an equivalent circuit in which both said ground plane and said power plane are expressed by capacitors, inductors, and resistors,
      the equivalent circuit comprising a planar matrix of nodes, each of the adjacent nodes being connected by one of the inductors in series with one of the resistors, and each of the nodes being further connected to another of the resistors connected in parallel to a ground one of the capacitors to express dielectric loss by a dielectric contained in said PCB.

17. The equivalent circuit model expressed by an equivalent circuit according to claim 16, wherein, along a perimeter of said matrix representing a plane edge, said resistor connected to in parallel to the ground capacitor is also connected in parallel to a radiation resistor to express radiation loss caused by an emission of an electromagnetic wave plane and said power plane.

18. A PCB design support system provided with a control program for designing a PCB, wherein said control program causes a computer to carry out steps of:
   accepting input information about ground plane structure, power plane structure and layout of a PCB including information about positions of mounting active elements and at least one decoupling capacitor;
   building a circuit model for calculating, using input said information, voltage distribution between said ground plane and said power plane, the circuit model being a planar matrix of nodes, each of the adjacent nodes being connected by an inductor and a resistor, and each of the nodes being further connected to a grounded capacitor;

selecting a specified frequency and of calculating voltage distribution occurring at said specified frequency between said ground plane and said power plane;

displaying said obtained voltage distribution in a form of a two-dimensional voltage distribution map in a manner to correspond to a shape of said PCB; and deciding, using said voltage distribution map, a position of disposing a via-hole formed in a manner to straddle said ground plane and said power plane.

19. A PCB design support system provided with a control program for designing a PCB, wherein said control program causes a computer to carry out steps of:

accepting input information about ground plane structure, power plane structure and layout of a PCB including information about positions of mounting active elements and at least one decoupling capacitor;

building a circuit model for calculating, using input said information, distribution of currents flowing on both said ground plane and said power plane, the circuit model being a planar matrix of nodes, each of the adjacent nodes being connected by an inductor and a resistor, and each of the nodes being further connected to a grounded capacitor;

selecting a specified frequency and calculating distribution of currents flowing, at said specified frequency, in two directions in a manner being parallel to ends of said ground plane and said power plane, on both said ground plane and said power plane;

displaying separately said obtained two current distributions obtained in said two current flowing directions in a form of a two-dimensional current distribution map in a manner to correspond to a shape of said PCB; and deciding, by using said current distribution map, a position of installing wiring in a layer disposed between said ground plane and said power plane.

* * * * *